(12) United States Patent
Ikeda et al.

(10) Patent No.: US 6,340,863 B1
(45) Date of Patent: Jan. 22, 2002

(54) MICROWAVE PLASMA GENERATOR AND SYSTEM FOR DECOMPOSING ORGANIC HALIDE

(75) Inventors: Tetsuya Ikeda; Minoru Danno, both of Yokohama (JP)

(73) Assignee: Mitsubishi Heavy Industries, Ltd., Tokoyo (JP)

( * ) Notice: Subject to any disclaimer, the term of this patent is extended or adjusted under 35 U.S.C. 154(b) by 0 days.

(21) Appl. No.: 09/602,297

(22) Filed: Jun. 23, 2000

Related U.S. Application Data

(63) Continuation of application No. PCT/JP99/05862, filed on Oct. 22, 1999.

(30) Foreign Application Priority Data

Oct. 23, 1998 (JP) ............................................ 10-302994

(51) Int. Cl.[7] ................................................. H01J 7/46
(52) U.S. Cl. ............................. 315/111.21; 315/111.51; 204/164
(58) Field of Search ........................ 315/111.01, 111.11, 315/111.21, 111.31, 111.41, 111.51, 111.61, 111.71, 111.81, 111.91; 204/164, 165

(56) References Cited

U.S. PATENT DOCUMENTS

| | | | | |
|---|---|---|---|---|
| 4,883,570 A | * | 11/1989 | Efthimion et al. | .......... 204/164 |
| 5,650,693 A | * | 7/1997 | Campbell et al. | ....... 315/111.21 |
| 6,057,645 A | * | 5/2000 | Srivastava et al. | ...... 315/111.51 |

FOREIGN PATENT DOCUMENTS

| | | |
|---|---|---|
| JP | 1176700 | 7/1989 |
| JP | 2-131116 | 5/1990 |
| JP | 395899 | 4/1991 |
| JP | 3222298 | 10/1991 |
| JP | 7-24081 | 1/1995 |
| JP | 780286 | 3/1995 |
| JP | 780287 | 3/1995 |
| JP | 8236293 | 9/1996 |
| JP | 9148096 | 6/1997 |
| JP | 9-150055 | 6/1997 |
| JP | 9262459 | 10/1997 |
| JP | 10249161 | 9/1998 |
| JP | WO0025557 A | 4/2000 |

* cited by examiner

*Primary Examiner*—Don Wong
*Assistant Examiner*—Wilson Lee
(74) *Attorney, Agent, or Firm*—John P. White; Cooper & Dunham LLP

(57) ABSTRACT

A discharge tube (11) made of a dielectric material extends through a hole (3) of a rectangular waveguide (1) and through a coaxial microwave cavity (4) so as to be coaxial with the central axis of the cavity (4). This discharge tube (11) has a double-tube structure including an outer tube (12) and an inner tube (13). The sectional area of an annular gap formed between the outer tube (12) and the inner tube (13) is held constant over the entire length of the inner tube (13). This allows the generation of a stable thermal plasma when a reaction gas containing an organic halide and water vapor is supplied into the outer tube through the annular gap with a microwave transmitted from the rectangular waveguide (1) into the cavity (4).

21 Claims, 14 Drawing Sheets

US 6,340,863 B1

MICROWAVE PLASMA GENERATOR AND SYSTEM FOR DECOMPOSING ORGANIC HALIDE

CROSS REFERENCE TO RELATED APPLICATIONS

This is a continuation of Application No. PCT/JP99/05862, filed Oct. 22, 1999.

This application is based upon and claims the benefit of priority from the prior Japanese Patent Application No. 10-302994, filed Oct. 23, 1998, the entire contents of which are incorporated herein by reference.

BACKGROUND OF THE INVENTION

The present invention relates to a microwave plasma generator useful to decompose particularly organic halides, such as freon and trichloromethane, in which the structure of a discharge tube for microwave plasma generation is improved, and a method and system for decomposing organic halides such as freon and trichloromethane.

Large amounts of organic halides such as freon, trichloromethane, and halon, containing fluorine, chlorine, bromine, and the like in molecules, are used in a variety of applications such as refrigerants, solvents, and fire extinguishers. However, these compounds are highly volatile, so many of them are emitted, without being processed, to environments such as the air, soil, and water. Such emitted gases are found to have large influence on environments, e.g., produce carcinogens, destroy the ozonosphere, and cause global warming. Hence, it is necessary to make these organic halides harmless from the viewpoint of environmental protection.

Conventionally reported organic halide processing methods primarily use decomposition reaction at high temperatures. These processing methods are roughly classified into the incineration method and the plasma method.

In the incineration method, volatile organic halides are incinerated together with common wastes such as resins. To burn them in a waste incinerator, corrosion resistance must be improved as a measure against hydrogen chloride which is a strong acid and corrosive. Also, since a combustion temperature different from those for combustion of common resins is set, these organic halides must be separately burned. Furthermore, the exhaust amounts of, e.g., hydrogen chloride and dioxine are strictly restricted. As a consequence, the processing amount cannot be thoughtlessly increased to avoid a primary cause of, e.g., an unstable combustion temperature.

As the plasma method, a method of decomposing a volatile organic halide into carbon dioxide, hydrogen chloride, and hydrogen fluoride by reacting the halide with water vapor in a plasma is known as a dedicated decomposing apparatus for, e.g., freon.

Jpn. Pat. Appln. KOKAI Publication No. 3-222298 has disclosed a microwave plasma trace element analyzer including a double-structure discharge tube shown in FIG. 17. A double-structure discharge tube 201 shown in FIG. 17 is made of quartz and comprises a cylindrical outer tube 202 and a cylindrical inner tube 203. A reaction gas supply pipe 204 is connected to the outer tube 202 in the direction of tangent of this outer tube 202. A tapered large-diameter cylindrical portion 205 of thick section is formed at the end portion of the inner tube 203, thereby narrowing the space between the cylindrical portion 205 of this inner tube 203 and the outer tube 202. The discharge tube 201 is inserted through a microwave cavity 207 having a metal conductor 206 and a rectangular waveguide 208.

A reaction gas 209 is supplied through the supply pipe 204 to the space between the outer tube 202 and the inner tube 203 in the discharge tube 201, where the gap between an antenna and a cavity end plate, or between inner and outer conductors, in the cavity 207 is positioned. This reaction gas 209 is injected from the exit end of this space. At the same time, a carrier gas 210 is supplied into the inner tube 203 and blown off from an injection opening 211 open at the end portion of the inner tube 103, thereby generating a plasma 212 by discharge. In elemental analysis, for example, nitrogen gas or the like is used as the reaction gas 209, and Ar or He is used as the carrier gas 210.

The plasma is ignited by using a Tesla coil placed outside and near the discharge tube 201 at the microwave cavity exit or an ignition coil 214 connected to an ignition power supply 213 such as a neon transformer.

When Ar gas is used as the carrier gas, however, the running cost increases.

If the flow rate of the carrier gas is increased, the generation of a plasma becomes unstable.

Also, since the injection opening 211 of the inner tube 203 for injecting the carrier gas is very small, this portion is readily damaged by, e.g., melting by a plasma.

Additionally, the gas flow path between the inner tube 203 and the outer tube 202 is narrowed by the tapered large-diameter cylindrical portion 205 of thick section formed at the end portion of the inner tube 203. Although this raises the reaction gas injection rate, the plasma 212 flows backward in the space around the cylindrical portion 205. Consequently, the cylindrical portion 205 of the inner tube 203 melts and breaks.

On the other hand, to prevent the contact of a plasma with the wall surface of the discharge tube 201, the gas flow in the discharge tube 201 is usually given a swirling flow effect in the gap between the outer tube 202 and the inner tube 203 by connecting the gas supply pipe 204 to the outer tube 202 in the direction of tangent of this outer tube 202. However, this effect is lost because the thick cylindrical portion 205 of the inner tube 203 narrows the flow path formed by the gap. Consequently, even a slight change in the plasma state causes nonuniform discharge or melts the discharge tube 201.

BRIEF SUMMARY OF THE INVENTION

It is an object of the present invention to provide a microwave plasma generator capable of stably and efficiently generating a plasma.

It is another object of the present invention to provide a method of decomposing an organic halide capable of efficiently decomposing volatile organic halides such as freon and trichloromethane.

It is still another object of the present invention to provide an organic halide decomposing system capable of efficiently decomposing volatile organic halides such as freon and trichloromethane.

A microwave plasma generator according to the present invention comprises:

a rectangular waveguide having a hole to transmit a microwave;

a coaxial microwave cavity connected to the rectangular waveguide by communicating with the hole; and a discharge tube which is made of a dielectric material, extends through the hole of the rectangular waveguide, and extends through the cavity so as to be coaxial with a central axis of the cavity, wherein the discharge tube has a double-tube structure including outer and inner tubes, a sectional area of an annular gap formed between the outer and inner tubes is constant over an entire length of the inner tube, and an end portion of the inner tube has a gas injection opening having the same diameter as an internal cavity of the inner tube.

Another microwave plasma generator according to the present invention comprises:

a rectangular waveguide having a hole to transmit a microwave;

a cylindrical microwave resonance cavity which is connected to the rectangular waveguide by communicating with the hole and is placed such that a central axis of the resonance cavity aligns with the direction of electric field in the rectangular waveguide; and a discharge tube which is made of a dielectric material, extends through the hole of the rectangular waveguide, and extends through the resonance cavity so as to be coaxial with the central axis of the cavity, wherein the discharge tube has a double-tube structure including outer and inner tubes, a sectional area of an annular gap formed between the outer and inner tubes is constant over an entire length of the inner tube, and an end portion of the inner tube has a gas injection opening having the same diameter as an internal cavity of the inner tube.

In a method of decomposing an organic halide according to the present invention, which decomposes an organic halide in a plasma by using a microwave plasma generator comprising a rectangular waveguide having a hole to transmit a microwave, a coaxial microwave cavity connected to the rectangular waveguide by communicating with the hole, and a discharge tube which is made of a dielectric material, extends through the hole of the rectangular waveguide, and extends through the cavity so as to be coaxial with a central axis of the cavity, wherein the discharge tube has a double-tube structure including outer and inner tubes, a sectional area of an annular gap formed between the outer and inner tubes is constant over an entire length of the inner tube, and an end portion of the inner tube has a gas injection opening having the same diameter as an internal cavity of the inner tube, a gas containing the organic halide, water vapor, and air is supplied to the annular gap formed between the outer and inner tubes to generate a plasma, in the outer tube, which extends from the vicinity of the end portion of the inner tube toward an end portion of the outer tube.

In another method of decomposing an organic halide according to the present invention, which decomposes an organic halide in a plasma by using a microwave plasma generator comprising a rectangular waveguide having a hole to transmit a microwave, a coaxial microwave cavity connected to the rectangular waveguide by communicating with the hole, and a discharge tube which is made of a dielectric material, extends through the hole of the rectangular waveguide, and extends through the cavity so as to be coaxial with a central axis of the cavity, wherein the discharge tube has a double-tube structure including outer and inner tubes, a sectional area of an annular gap formed between the outer and inner tubes is constant over an entire length of the inner tube, and an end portion of the inner tube has a gas injection opening having the same diameter as an internal cavity of the inner tube, the organic halide is supplied into the inner tube, and a gas containing water vapor and air is supplied to the annular gap formed between the outer and inner tubes, thereby generating a plasma, in the outer tube, which extends from the vicinity of the end portion of the inner tube toward an end portion of the outer tube.

In still another method of decomposing an organic halide according to the present invention, which decomposes an organic halide in a plasma by using a microwave plasma generator comprising a rectangular waveguide having a hole to transmit a microwave, a cylindrical microwave resonance cavity connected to the rectangular waveguide by communicating with the hole and placed such that a central axis of the resonance cavity aligns with the direction of electric field in the rectangular waveguide, and a discharge tube which is made of a dielectric material, extends through the hole of the rectangular waveguide, and extends through the resonance cavity so as to be coaxial with the central axis of the cavity, wherein the discharge tube has a double-tube structure including outer and inner tubes, a sectional area of an annular gap formed between the outer and inner tubes is constant over an entire length of the inner tube, and an end portion of the inner tube has a gas injection opening having the same diameter as an internal cavity of the inner tube, a gas containing the organic halide, water vapor, and air is supplied to the annular gap formed between the outer and inner tubes to generate a plasma, in the outer tube, which extends from the vicinity of the end portion of the inner tube toward an end portion of the outer tube.

In still another method of decomposing an organic halide according to the present invention, which decomposes an organic halide in a plasma by using a microwave plasma generator comprising a rectangular waveguide having a hole to transmit a microwave, a cylindrical microwave resonance cavity connected to the rectangular waveguide by communicating with the hole and placed such that a central axis of the resonance cavity aligns with the direction of electric field in the rectangular waveguide, and a discharge tube which is made of a dielectric material, extends through the hole of the rectangular waveguide, and extends through the resonance cavity so as to be coaxial with the central axis of the cavity, wherein the discharge tube has a double-tube structure including outer and inner tubes, a sectional area of an annular gap formed between the outer and inner tubes is constant over an entire length of the inner tube, and an end portion of the inner tube has a gas injection opening having the same diameter as an internal cavity of the inner tube, the organic halide is supplied into the inner tube, and a gas containing water vapor and air is supplied to the annular gap formed between the outer and inner tubes, thereby generating a plasma, in the outer tube, which extends from the vicinity of the end portion of the inner tube toward an end portion of the outer tube.

Another microwave plasma generator according to the present invention comprises:

a rectangular waveguide having a hole to transmit a microwave;

a cylindrical microwave resonance cavity which is connected to the rectangular waveguide by communicating with the hole and is placed such that a central axis of the resonance cavity aligns with the direction of electric field in the rectangular waveguide;

a discharge tube which is made of a dielectric material, extends through the hole of the rectangular waveguide, and extends through the resonance cavity so as to be coaxial with the central axis of the cavity;

a metal conductor which is connected, while being fitted in the discharge tube, to a portion of the discharge tube near the hole, and extends into the resonance cavity through the hole; and a slidable probe antenna which is interposed between the metal conductor and the discharge tube so as to be slidable in an axial direction of the discharge tube, and extends into the resonance cavity through the hole in the rectangular waveguide.

Still another microwave plasma generator according to the present invention comprises:

a rectangular waveguide having a hole to transmit a microwave;

a cylindrical microwave resonance cavity which is connected to the rectangular waveguide by communicating with the hole, is placed such that a central axis of the resonance cavity aligns with the direction of electric field in the rectangular waveguide, and has an end plate on a bottom portion;

a discharge tube which is made of a dielectric material, extends through the hole of the rectangular waveguide, and extends through the resonance cavity so as to be coaxial with the central axis of the cavity;

a metal conductor which is connected, while being fitted in the discharge tube, to a portion of the discharge tube near the hole, and extends into the resonance cavity through the hole; and an annular metal conductor which is interposed between the end plate of the resonance cavity and the discharge tube extending through the end plate, and extends from the outside to the inside of the cavity.

Still another microwave plasma generator according to the present invention comprises:

a rectangular waveguide having a hole to transmit a microwave;

a cylindrical microwave resonance cavity which is connected to the rectangular waveguide by communicating with the hole, is placed such that a central axis of the resonance cavity aligns with the direction of electric field in the rectangular waveguide, and has an end plate on a bottom portion;

a discharge tube which is made of a dielectric material, extends through the hole of the rectangular waveguide, and extends through the resonance cavity so as to be coaxial with the central axis of the cavity; and a metal conductor which is connected, while being fitted in the discharge tube, to a portion of the discharge tube near the hole, and extends into the resonance cavity through the hole, wherein the end plate of the resonance cavity has a tapered projection, which projects toward the metal conductor, in a portion through which the discharge tube extends.

In a method of decomposing an organic halide according to the present invention, a thermal plasma is generated by irradiating a gas containing an organic halide with a microwave, thereby decomposing the organic halide.

A system for decomposing an organic halide according to the present invention comprises:

a rectangular waveguide having a hole to transmit a microwave;

a coaxial microwave cavity connected to the rectangular waveguide by communicating with the hole;

a reaction tube placed below the cavity;

a discharge tube which is made of a dielectric material, extends through the hole of the rectangular waveguide, and extends into the reaction tube through the cavity so as to be coaxial with the central axis of the cavity;

a metal conductor which is connected, while being fitted in the discharge tube, to a portion of the discharge tube near the hole, and extends into the resonance cavity through the hole;

a vessel into which a lower end of the reaction tube is inserted and which contains an aqueous alkali solution; and gas supply means for supplying a gas containing an organic halide to the discharge tube.

Another system for decomposing an organic halide according to the present invention comprises:

a rectangular waveguide having a hole to transmit a microwave;

a coaxial microwave cavity connected to the rectangular waveguide by communicating with the hole;

a reaction tube placed below the cavity;

a discharge tube which is made of a dielectric material, extends through the hole of the rectangular waveguide, and extends into the reaction tube through the cavity so as to be coaxial with the central axis of the cavity;

a metal conductor which is connected, while being fitted in the discharge tube, to a portion of the discharge tube near the hole, and extends into the resonance cavity through the hole;

a vessel into which a lower end of the reaction tube is inserted and which contains an aqueous alkali solution;

gas supply means for supplying a gas containing an organic halide to the discharge tube through first piping;

water supply means connected to the first piping through second piping; and heating means, provided for the second piping, for converting water flowing in the second piping into water vapor.

Still another system for decomposing an organic halide according to the present invention comprises:

a rectangular waveguide having a hole to transmit a microwave;

a coaxial microwave cavity connected to the rectangular waveguide by communicating with the hole;

a reaction tube placed below the cavity;

a discharge tube which is made of a dielectric material, extends through the hole of the rectangular waveguide, and extends into the reaction tube through the cavity so as to be coaxial with the central axis of the cavity;

a metal conductor which is connected, while being fitted in the discharge tube, to a portion of the discharge tube near the hole, and extends into the resonance cavity through the hole;

a vessel into which a lower end of the reaction tube is inserted and which contains an aqueous alkali solution;

gas supply means for supplying a gas containing an organic halide to the discharge tube; and water vapor spraying means, formed in a circumferential wall of the reaction tube, for spraying water vapor into a thermal plasma generation region near a lower end portion of the discharge tube.

Still another system for decomposing an organic halide according to the present invention comprises:

a rectangular waveguide having a hole to transmit a microwave;

a coaxial microwave cavity connected to the rectangular waveguide by communicating with the hole;

a reaction tube placed below the cavity;

a discharge tube which is made of a dielectric material, extends through the hole of the rectangular waveguide, and extends into the reaction tube through the cavity so as to be coaxial with the central axis of the cavity;

a metal conductor which is connected, while being fitted in the discharge tube, to a portion of the discharge tube near the hole, and extends into the resonance cavity through the hole;

a vessel into which a lower end of the reaction tube is inserted and which contains an aqueous alkali solution;

gas supply means for supplying a gas containing an organic halide to the discharge tube; and alkali water spraying means, formed in a side wall of the reaction tube, for spraying alkali water into a thermal plasma generation region near a lower end portion of the discharge tube.

Still another system for decomposing an organic halide according to the present invention comprises:

a rectangular waveguide having a hole to transmit a microwave;

a coaxial microwave cavity connected to the rectangular waveguide by communicating with the hole;

a reaction tube placed below the cavity;

a discharge tube which is made of a dielectric material, extends through the hole of the rectangular waveguide, and extends into the reaction tube through the cavity so as to be coaxial with the central axis of the cavity;

a metal conductor which is connected, while being fitted in the discharge tube, to a portion of the discharge tube near the hole, and extends into the resonance cavity through the hole;

a vessel into which a lower end of the reaction tube is inserted and which contains an aqueous alkali solution;

gas supply means for supplying a gas containing an organic halide to the discharge tube; and heating means, installed in at least one of a position around the reaction tube and a position below the vessel, for vaporizing the aqueous alkali solution in the vessel and introducing water vapor into a thermal plasma generation region near a lower end portion of the discharge tube.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

Microwave plasma generators and methods and systems for decomposing an organic halide (e.g., freon gas) by using a thermal plasma according to embodiments of the present invention will be described below with reference to the accompanying drawings.

First Embodiment

Figure 1:
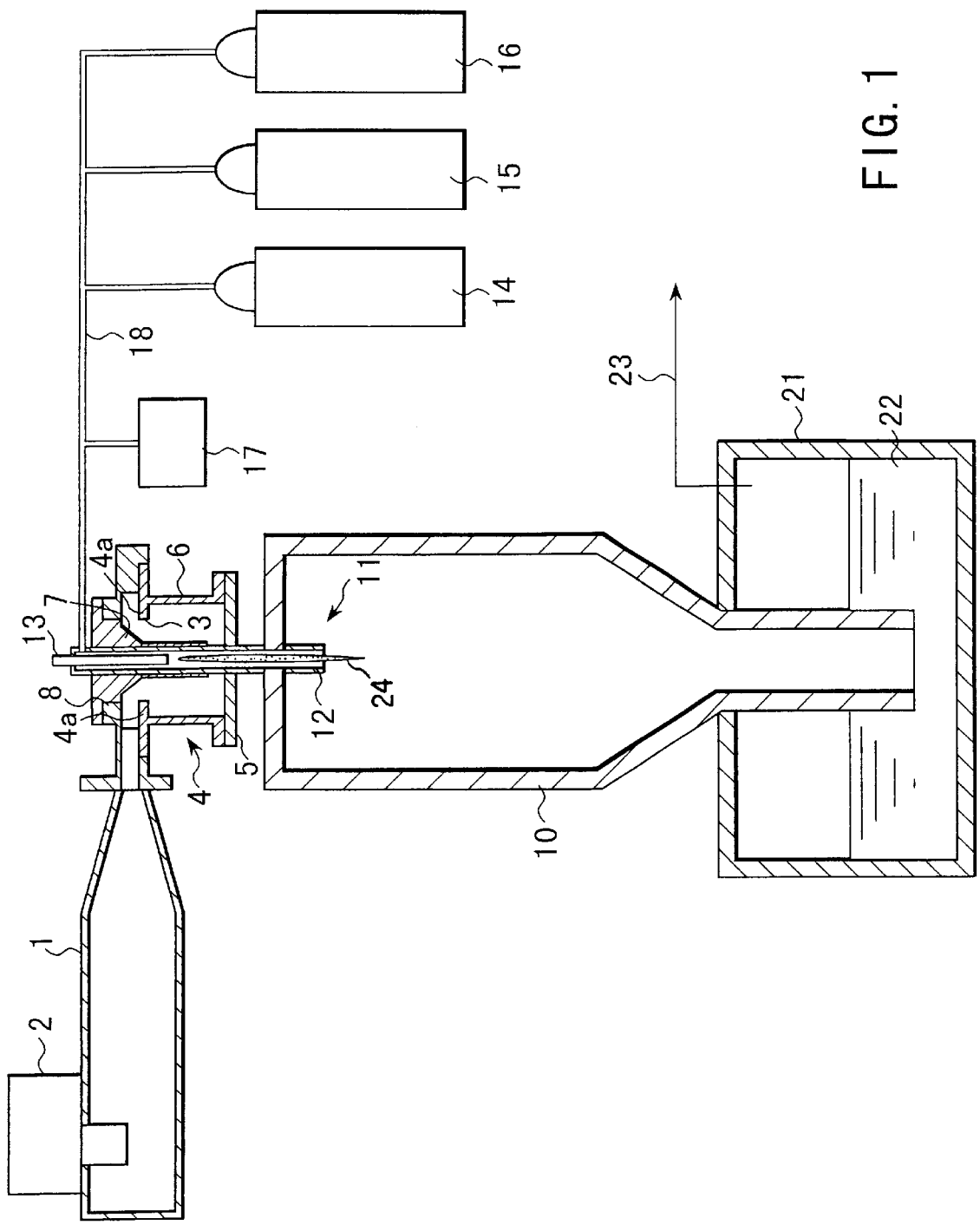
FIG. 1 is a sectional view showing an organic halide decomposing system including a microwave plasma generator according to the first embodiment of the present invention.
Figure 2:
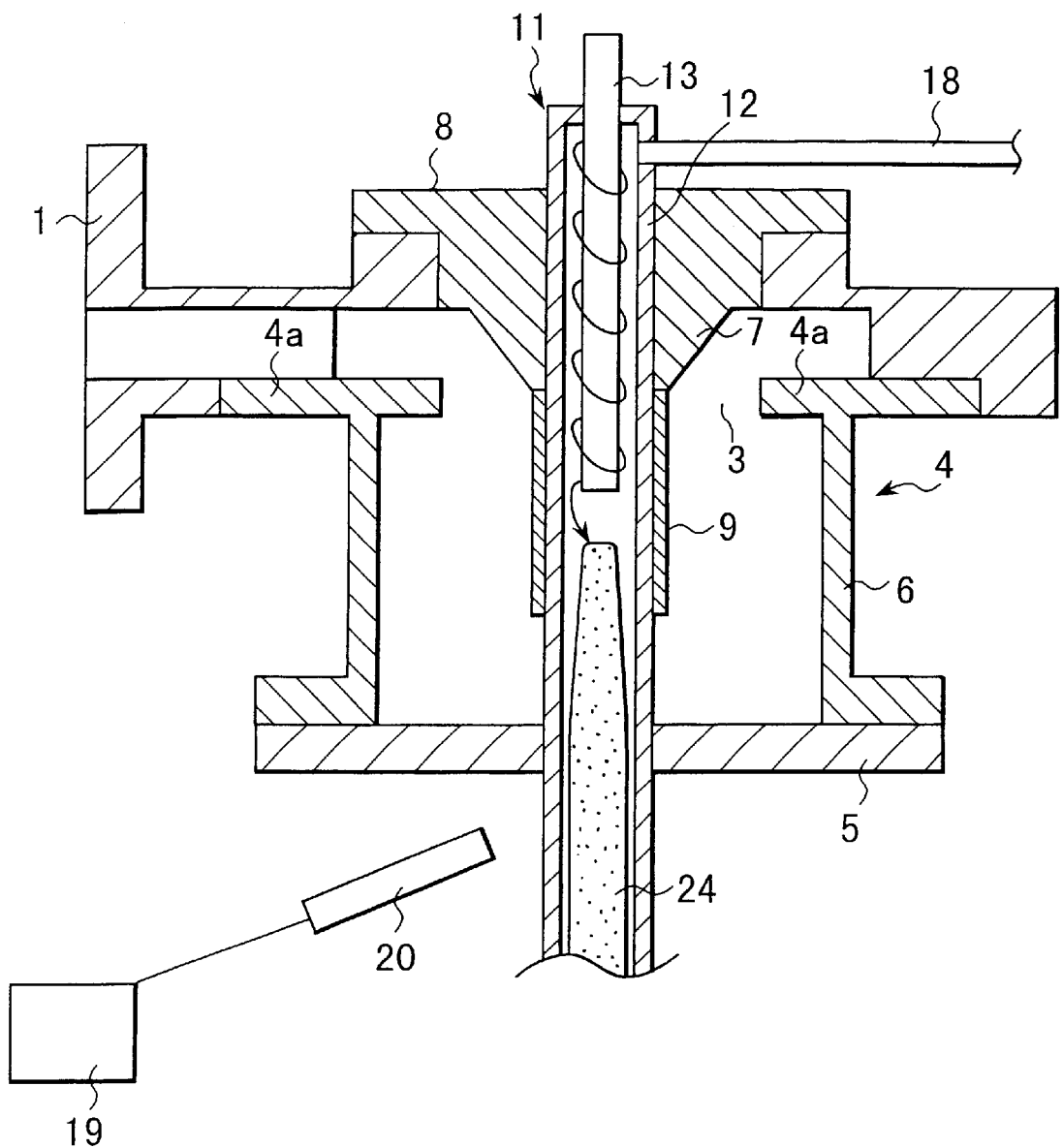
FIG. 2 is a sectional view of the microwave plasma generator shown in FIG. 1.

FIG. 1 is a sectional view showing an organic halide (e.g., freon) decomposing system including a microwave plasma generator having a coaxial microwave cavity according to this first embodiment. FIG. 2 is a sectional view of the microwave plasma generator shown in FIG. 1.

Referring to FIG. 1, a horizontally extending rectangular waveguide 1 has a microwave oscillator 2, which oscillates a microwave with a frequency of 2.45 GHz, in its start end portion (left-hand end), and has a hole 3 in this end portion. This rectangular waveguide 1 transmits a microwave from the start end portion toward a terminal end portion (right-hand end).

As shown in FIG. 2, a coaxial microwave cavity 4 is so connected as to extend vertically by communicating with the hole 3 of the rectangular waveguide 1. This cavity 4 includes an end plate 5, a cylindrical outer conductor 6, a metal conductor 8, and a cylindrical inner conductor 9. The end plate 5 is positioned on the bottom portion of the cavity 4, and the outer conductor 6 is fixed on this end plate 5. The metal conductor 8 is fixed to the rectangular waveguide 1 near the hole 3 and has an inverse conical portion 7 extended into the outer conductor 6. A hole is formed through the center of this metal conductor 8. The inner conductor 9 extends from the lower end of the inverse conical portion 7 of the metal conductor 8 toward a position below the middle position of the outer conductor 6 and is placed coaxially with the outer conductor 8. Reference numeral 4a denotes a throttle plate which is formed on the upper surface of the cavity 4 and defines the hole 3 of the rectangular waveguide 1, i.e., the connecting portion between the rectangular waveguide 1 and the cavity 4. A reaction tube 10 is placed below the coaxial microwave cavity 4.

A discharge tube 11 made of a dielectric material, e.g., quartz, extends through the end plate 5 from the hole in the metal conductor 8 via the inner conductor 9 and is inserted into the reaction tube 10. That is, this discharge tube 11 is so placed as to be coaxial with the central axis of the coaxial microwave cavity 4 and extends through the rectangular waveguide 1 and the cavity 4.

The discharge tube 11 has a double-tube structure including an outer tube 12 whose upper end is closed and an inner tube 13 coaxially inserted into this outer tube 12 from its upper end. Both the outer and inner tubes 12 and 13 are straight tubes. That is, in its end portion (lower end portion) the inner tube 13 has a gas injection opening having the same diameter as the internal cavity of this inner tube 13. The sectional area of an annular gap formed between the outer and inner tubes 12 and 13, i.e., the sectional area of the annular gap formed between the outer and inner tubes 12 and 13 in a section perpendicular to the longitudinal direction of the discharge tube 11, is constant over the entire length of the inner tube 13.

Freon from a freon gas container 14, air from an air container 15, argon from an argon container 16, and water vapor from a water vapor generator 17 are supplied through a gas supply pipe 18 to a portion above the annular gap formed between the outer and inner tubes 12 and 13 of the discharge tube 11. The gas supply pipe 18 is connected along the direction of tangent of the outer tube 12.

As shown in FIG. 2, an ignition electrode 20 connected to an ignition power supply 19 outside the outer tube 12 of the discharge tube 11 ignites a thermal plasma.

The lower end of the reaction tube 10 is dipped into an aqueous alkali solution 22 in a vessel 21. An exhaust duct 23 is connected to the upper portion of this vessel 21.

The function of the aforementioned microwave plasma generator and a method of decomposing an organic halide, e.g., freon, by using the organic halide decomposing system including this generator will be described below.

The microwave oscillator 2 is operated to generate a microwave. This microwave is transmitted by the rectangular waveguide 1 and then transmitted to the coaxial microwave cavity 4 through the metal conductor 8 and the inner conductor 9. As a consequence, in the cavity 4 an axial-direction electric field is formed between the inner conductor 9 and the end plate 5.

With the microwave thus transmitted into the coaxial microwave cavity 4, freon gas and a gas containing water vapor are supplied through the gas supply pipe 18 into the annular gap formed between the outer and inner tubes 12 and 13 of the discharge tube 11, and the ignition power supply 19 is operated to allow the ignition electrode 20 to discharge. Consequently, a thermal plasma 24 having high electron energy and a temperature of 2,000 to 6,000 K is generated in the discharge tube 11. This thermal plasma 24 extends from the discharge tube 11 into the reaction tube 10 at the lower end of the discharge tube 11. This makes the freon gas readily dissociable into chlorine, fluorine, and hydrogen atoms, so the freon gas reacts with water vapor. For example, freon R12 ($CCl_2F_2$) used in a refrigerant of an air-conditioner is easily decomposed by reaction indicated by $$CCl_2F_2 + 2H_2O \rightarrow 2HCl + 2HF + CO_2 \tag{1}$$

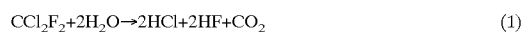

Also, even freon 134a ($CF_3CH_2F$) known as alternate freon not containing chlorine and assumed to be comparatively difficult to decompose is readily decomposed by reaction indicated by $$CF_3CH_2F + 2H_2O \rightarrow 4HF + CO_2 + C \tag{2}$$

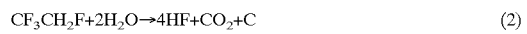

C converts to $CO_2$ in the presence of oxygen or the like.

The decomposed gas from the reaction tube 10 is made harmless by reaction indicated by formula 3 below by passing through the aqueous alkali solution (e.g., calcium hydroxide) 22 contained in the vessel 21. The gas containing carbonic acid gas and the like is exhausted from the exhaust duct 23.

$$2HCl + 2HF + 2Ca(OH)_2 \rightarrow CaCl_2 + CaF_2 + 4H_2O \tag{3}$$

In the microwave plasma generator according to the first embodiment as described above, a straight tube is used as the inner tube 13 forming the double-tube structure of the discharge tube 11 so that the sectional area of the annular gap formed between this inner tube 13 and the outer tube 12 is constant. Accordingly, the gas described above can be injected at high flow rate from the annular gap, and this enhances the gas blowing effect. As a consequence, a stable thermal plasma can be generated. Therefore, once this thermal plasma is ignited, disappearance of the thermal plasma can be prevented even when the supply of Ar gas as a carrier gas is stopped to switch to freon or water vapor. This can suppress the consumption of Ar gas.

Figure 17:
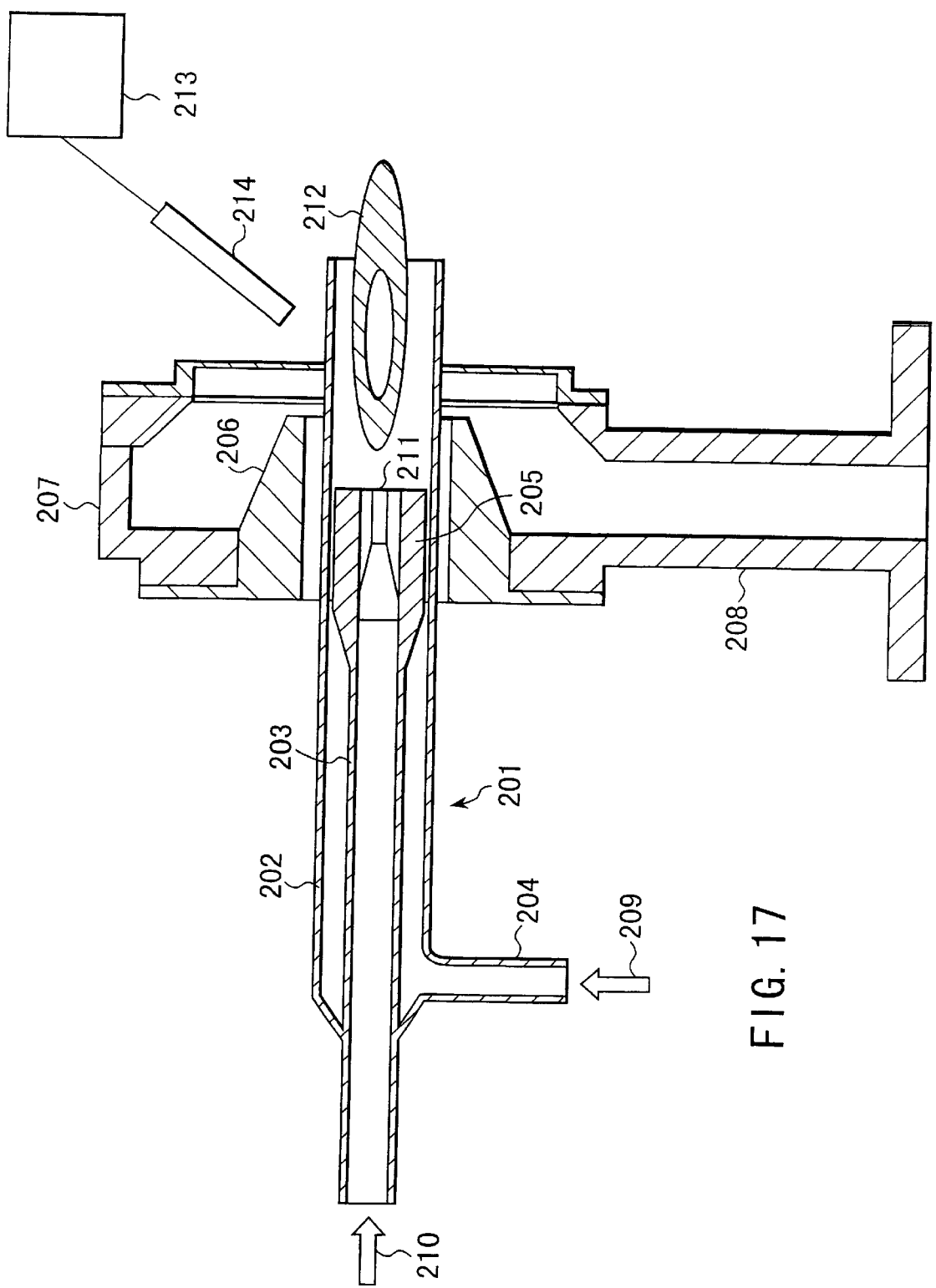
FIG. 17 is a sectional view showing a conventional microwave plasma generator.

Also, the injection opening of the inner tube 13 is made larger than the conventional inner tube injection opening shown in FIG. 17. This can prevent damage to the inner tube 13 by the thermal plasma 24 and also prevent adhesion of soot and condensation of water vapor.

Furthermore, the gas supply pipe 18 is connected to the discharge tube 11 along the direction of tangent of the outer tube 12. Therefore, when the gas is supplied to the aforementioned annular gap through the gas supply pipe 18, the gas can be swirled as indicated by the arrow in FIG. 2. Since the sectional area of the annular gap formed between the inner and outer tubes 13 and 12 is held constant, this swirling flow effect reaches the exit of the annular gap, and the gas is injected into the plasma generation region. Hence, the flow rate on the inner wall of the outer tube 12 can be raised as when the gap between the inner and outer tubes is narrowed by increasing the diameter of the exit of the inner tube in the conventional microwave plasma generator shown in FIG. 17. Also, the flow amount of gas injected from the gap can be increased as described previously. Consequently, in a portion of the outer tube 12 near the exit of the gap, the effect of blowing off the gas from the inner wall of the outer tube 12 increases. This generates a stabler thermal plasma near the center of the outer tube 12. Accordingly, disappearance of the thermal plasma can be prevented even when the supply of Ar gas as a carrier gas is stopped to switch to freon or water vapor. This can suppress the consumption of Ar gas.

Moreover, an organic halide such as freon can be easily decomposed and made harmless by the use of the decomposing system as shown in FIG. 1.

In the first embodiment described above, the ignition electrode is placed near the portion of the discharge tube extending outside the cavity. However, the ignition electrode can also be inserted into the inner tube of the discharge tube. Alternatively, an ignition electrode in the form of a coil can be inserted into the inner tube of the discharge tube.

Also, in the first embodiment described above, freon gas and a gas containing water vapor are supplied into the annular gap formed between the outer and inner tubes 12 and 13 of the discharge tube 11, thereby decomposing the freon. However, the present invention is not limited to this embodiment. For example, it is also possible to supply the organic halide into the inner tube 13 and supply water vapor to the annular gap formed between the outer and inner tubes 12 and 13 to generate in the outer tube 12 a plasma which extends from the end portion of the inner tube 13 to the end portion of the outer tube 12, thereby decomposing the freon.

EXAMPLE 1

In this Example 1, the organic halide decomposing system including the microwave plasma generator according to the first embodiment described above was used to decompose freon R12 ($CCl_2F_2$) and freon 134a ($CH_2CF_4$) under the conditions explained below.

That is, the inside diameter and length of the coaxial microwave cavity 4 for generating a thermal plasma shown in FIGS. 1 and 2 were set to 40 mm and 50 mm, respectively, and the gap length between the inner conductor 9 and the end plate 5 of the cavity 4 was set to 20 mm.

Inside the cavity 4, the quartz discharge tube 11 ran through the metal conductor 8, the inner conductor 9, and the end plate 5. This discharge tube 11 was composed of the outer tube 12 (outside diameter 13 mm, inside diameter 10 mm) and the inner tube 13 (outside diameter 6 mm, inside diameter 4 mm).

To the discharge tube 11 in the cavity 4, freon (R12) was supplied at the atmospheric pressure and a flow rate of 6 L/min from the freon container 14, and water vapor was supplied at the atmospheric pressure and a flow rate of 12 L/min from the water vapor generator 17, both through the gas supply pipe 18. A 2.45-GHz microwave was introduced from the oscillator 2 into the coaxial microwave cavity 4 via the metal conductor 8 mounted on the rectangular waveguide 1 and the inner conductor 9, thereby discharging by an axial-direction electric field formed between the inner conductor 9 and the end plate 5. This discharge was found to be well stable even at the atmospheric pressure compared to discharge using a conventional apparatus.

The decomposition ratio of freon was measured by sampling a portion of the gas from the reaction tube 10 and calculating the presence/absence of a thermal plasma from gas chromatographic analysis of the freon concentration. Freon and water vapor were supplied to the inner tube and the outer tube (the gap between the inner and outer tubes) of the discharge tube by different methods. Table 1 below shows the decomposition ratio measurement results obtained by gas chromatographic analysis when the freon supply amount was 1 kg/h and the microwave power was 1,200 W.

The same test was conducted on freon 134a into which air was mixed. The results are also shown in Table 1.

TABLE 1

| Freon | | Water vapor | | | Decomposition | Decomposition |
| --- | --- | --- | --- | --- | --- | --- |
| Outer tube flow rate | Inner tube | Outer tube flow rate | Inner tube | Quality of discharge* | ratio (R12) | ratio (134a) |
| 6 L/min | 0 L/min | 0 L/min | 12 L/min | D | — | — |
| 3 L/min | 3 L/min | 6 L/min | 6 L/min | D | — | — |
| 0 L/min | 6 L/min | 12 L/min | 0 L/min | D | — | — |
| 6 L/min | 0 L/min | 12 L/min | 0 L/min | A | 99.99 or more | 99.99% or more |

*Quality of discharge:
A; Discharge was good, and the discharge tube neither deformed nor melted.
B; Became red-hot.
C; Changed (softened) by melting.
D; Melted immediately after discharge.

As is apparent from Table 1, when freon and water vapor were supplied only to the annular gap between the outer and inner tubes 12 and 13 of the discharge tube 11, a thermal plasma was ignited, and a satisfactory decomposition ratio was obtained. Similar decomposition was also possible for freon 134a.

Note that it was experimentally confirmed that even when argon, air, or the like was mixed as an additional gas, a substantially equal decomposition ratio was obtained by controlling the microwave power.

Second Embodiment

Figure 3:
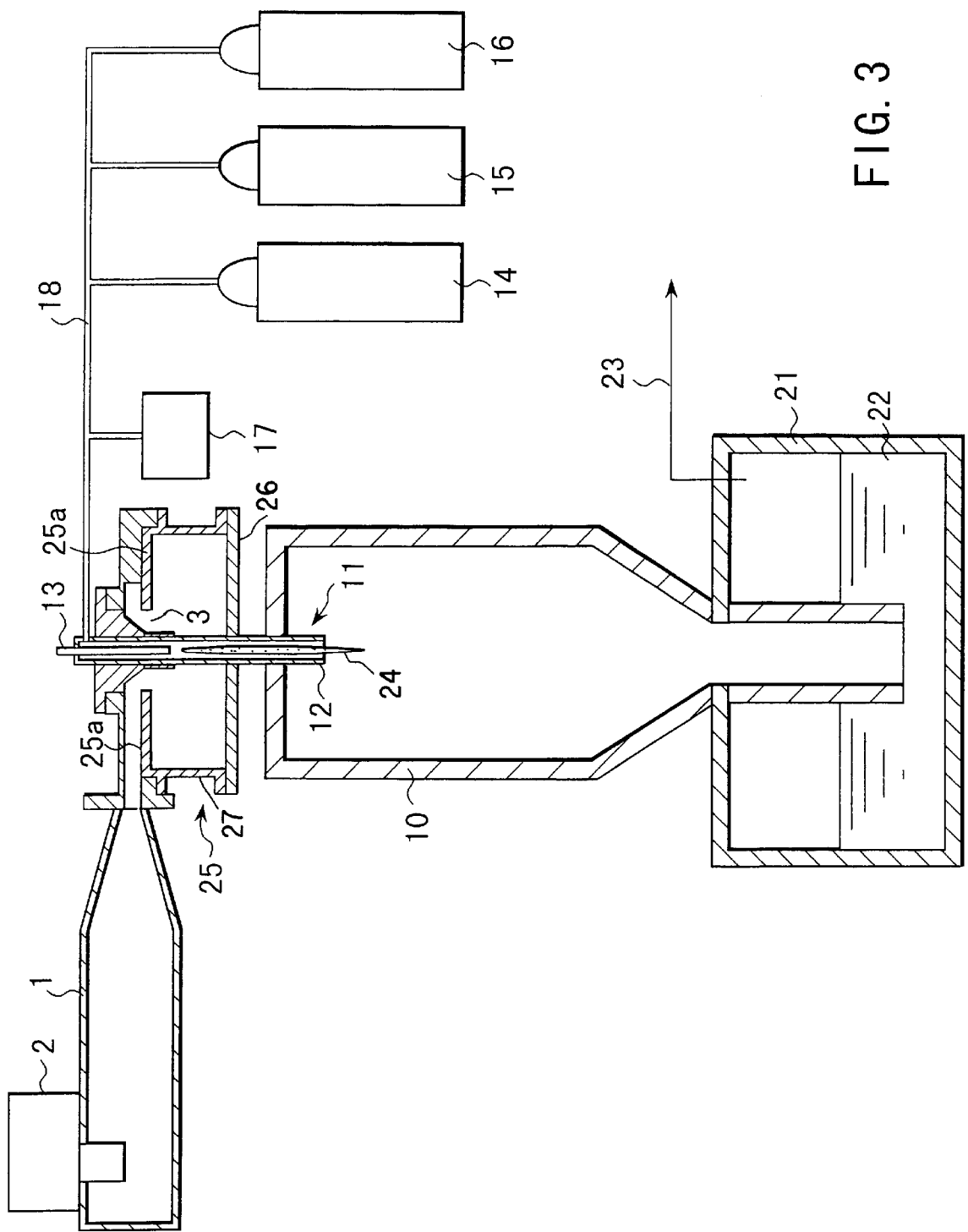
FIG. 3 is a sectional view showing an organic halide decomposing system including a microwave plasma generator according to the second embodiment of the present invention.
Figure 4:
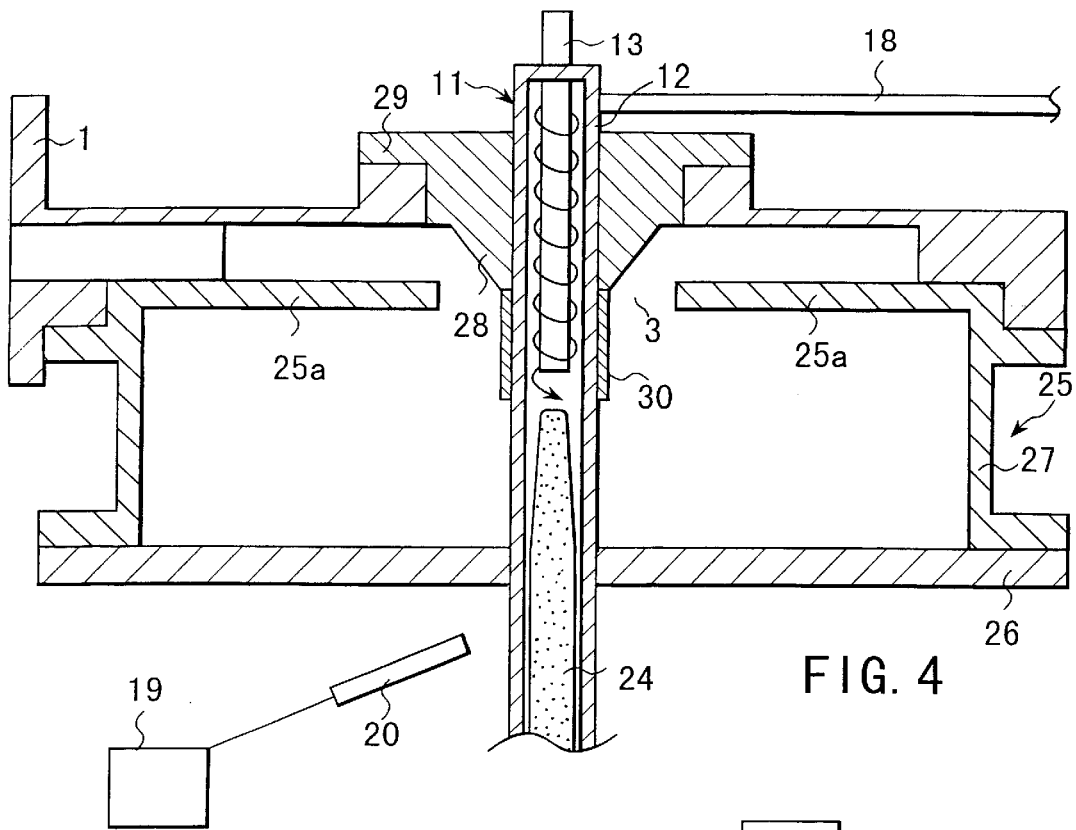
FIG. 4 is a sectional view of the microwave plasma generator shown in FIG. 3.

FIG. 3 is a sectional view showing an organic halide (e.g., freon) decomposing system including a microwave plasma generator having a cylindrical microwave resonance cavity according to the second embodiment of the present invention. FIG. 4 is a sectional view of the microwave plasma generator shown in FIG. 3. The same reference numerals as in FIGS. 1 and 2 denote the same parts in FIGS. 3 and 4, and a detailed description thereof will be omitted.

Referring to FIG. 3, a horizontally extending rectangular waveguide 1 has a microwave oscillator 2, which oscillates a microwave with a frequency of 2.45 GHz, in its start end portion (left-hand end), and has a hole 3 in this end portion. This rectangular waveguide 1 transmits a microwave from the start end portion toward a terminal end portion (right-hand end).

As shown in FIG. 4, a cylindrical microwave resonance cavity 25 is so connected as to extend vertically by communicating with the hole 3 of the rectangular waveguide 1. This cavity 25 includes an end plate 26, a cylindrical outer conductor 27, a metal conductor 29, and a cylindrical probe antenna 30. The end plate 26 is positioned on the bottom portion of the cavity 25 and has a larger diameter than that of the coaxial microwave cavity shown in FIG. 2. The outer conductor 27 is fixed on this end plate 26. The metal conductor 29 is fixed to the rectangular waveguide 1 near the hole 3 and has an inverse conical portion 28 extended into the outer conductor 27. A hole is formed through the center of this metal conductor 29. The probe antenna 30 extends from the lower end of the inverse conical portion 28 of the metal conductor 29 into the outer conductor 27 and is placed coaxially with the outer conductor 27. Reference numeral 25a denotes a throttle plate which is formed on the upper surface of the cavity 25 and defines the hole 3 of the rectangular waveguide 1, i.e., the connecting portion between the rectangular waveguide 1 and the cavity 25.

A discharge tube 11 made of a dielectric material, e.g., quartz, runs through the end plate 26 from the hole in the metal conductor 29 via the probe antenna 30 and is inserted into a reaction tube 10. That is, this discharge tube 11 is so placed as to be coaxial with the central axis of the cylindrical microwave resonance cavity 25 and extends through the rectangular waveguide 1 and the cavity 25.

The discharge tube 11 has a double-tube structure including an outer tube 12 whose upper end is closed and an inner tube 13 coaxially inserted into this outer tube 12 from its upper end. Both the outer and inner tubes 12 and 13 are straight tubes. That is, in its end portion (lower end portion) the inner tube 13 has a gas injection opening having the same diameter as the internal cavity of this inner tube 13. The sectional area of an annular gap formed between the outer and inner tubes 12 and 13, i.e., the sectional area of the annular gap formed between the outer and inner tubes 12 and 13 in a section perpendicular to the longitudinal direction of the discharge tube 11, is constant over the entire length of the inner tube 13.

The function of the aforementioned microwave plasma generator and a method of decomposing an organic halide, e.g., freon, by using the organic halide decomposing system including this generator will be described below.

The microwave oscillator 2 is operated to generate a microwave. This microwave is transmitted by the rectangular waveguide 1 and then transmitted to the cylindrical microwave resonance cavity 25 through the metal conductor 29 and the probe antenna 30. As a consequence, in the cavity 25 a large axial-direction electric field of $TM_{010}$ mode forms between the probe antenna 30 and the end plate 26. Additionally, this electric field in the cavity 25 is stable because the metal conductor 29 and the probe antenna 30 couple the electric field mode in the rectangular waveguide 1 and the electric field mode in the cylindrical microwave resonance cavity 25.

With the microwave thus transmitted into the cylindrical microwave resonance cavity 25, freon gas and a gas containing water vapor are supplied through a gas supply pipe 18 into the annular gap formed between the outer and inner tubes 12 and 13 of the discharge tube 11, and an ignition power supply 19 is operated to allow an ignition electrode 20 to discharge. Consequently, a thermal plasma 24 having high electron energy and a temperature of 2,000 to 6,000 K is generated in the discharge tube 11. This thermal plasma 24 extends from the discharge tube 11 into the reaction tube 10 at the lower end of the discharge tube 11. This makes the freon gas readily dissociable into chlorine, fluorine, and hydrogen atoms, so the freon gas reacts with water vapor. For example, freon R12 ($CCl_2F_2$) is easily decomposed by reaction indicated by formula 1 presented earlier.

The decomposed gas from the reaction tube 10 is made harmless by reaction indicated by formula 3 presented earlier by passing through an aqueous alkali solution (e.g., calcium hydroxide) 22 contained in a vessel 21. The gas containing carbonic acid gas and the like is exhausted from an exhaust duct 23.

In the microwave plasma generator according to the second embodiment as described above, a straight tube is used as the inner tube 13 forming the double-tube structure of the discharge tube 11 so that the sectional area of the annular gap formed between this inner tube 13 and the outer tube 12 is constant. Accordingly, the gas described above can be injected at high flow rate from the annular gap, and this enhances the gas blowing effect. As a consequence, a stable thermal plasma can be generated. Therefore, once this thermal plasma is ignited, disappearance of the thermal plasma can be prevented even when the supply of Ar gas as a carrier gas is stopped to switch to freon or water vapor. This can suppress the consumption of Ar gas.

Also, the injection opening of the inner tube 13 is made larger than the conventional inner tube injection opening shown in FIG. 17. This can prevent damage to the inner tube 13 by the thermal plasma 24 and also prevent adhesion of soot and condensation of water vapor.

Furthermore, the gas supply pipe 18 is connected to the discharge tube 11 along the direction of tangent of the outer tube 12. Therefore, when the gas is supplied to the aforementioned annular gap through the gas supply pipe 18, the gas can be swirled as indicated by the arrow in FIG. 4. Since the sectional area of the annular gap formed between the inner and outer tubes 13 and 12 is held constant, this swirling flow effect reaches the exit of the annular gap, and the gas is injected into the plasma generation region. Hence, the flow rate on the inner wall of the outer tube 12 can be raised as when the gap between the inner and outer tubes is narrowed by increasing the diameter of the exit of the inner tube in the conventional microwave plasma generator shown in FIG. 17. Also, the flow amount of gas injected from the gap can be increased as described previously. Consequently, in a portion of the outer tube 12 near the exit of the gap, the effect of blowing off the gas from the inner wall of the outer tube 12 increases. This generates a stabler thermal plasma near the center of the outer tube 12. Accordingly, disappearance of the thermal plasma can be prevented even when the supply of Ar gas as a carrier gas is stopped to switch to freon or water vapor. This can suppress the consumption of Ar gas.

Moreover, an organic halide such as freon can be easily decomposed and made harmless by the use of the decomposing system as shown in FIG. 3.

EXAMPLE 2

In this Example 2, the organic halide decomposing system including the microwave plasma generator according to the second embodiment described above was used to decompose freon R12 under the conditions explained below.

That is, the inside diameter and length of the cylindrical microwave resonance cavity 25 for generating a thermal plasma shown in FIGS. 3 and 4 were set to 90 mm and 50 mm, respectively, and the gap length between the probe antenna 30 and the end plate 26 of the cylindrical microwave resonance cavity 25 was set to 20 mm.

The discharge tube 11 was composed of the outer tube 12 (outside diameter 13 mm, inside diameter 10 mm) and the inner tube 13 (outside diameter 6 mm, inside diameter 4 mm).

To the discharge tube 11 in the cavity 25, freon (R12) was supplied at the atmospheric pressure and a flow rate of 6 L/min from a freon container 14, and water vapor was supplied at the atmospheric pressure and a flow rate of 12 L/min from a water vapor generator 17, both through the gas supply pipe 18. A 2.45-GHz microwave was introduced from the oscillator 2 into the cylindrical microwave resonance cavity 25 via the metal conductor 29 mounted on the rectangular waveguide 1 and the probe antenna 30, thereby discharging by an axial-direction electric field of $TM_{010}$ mode formed between the probe antenna 30 and the end plate 26.

By setting the freon supply amount to 1 kg/h and setting the water vapor supply amount such that the water/freon molar ratio was 2, freon and water vapor were supplied to the inner tube and the outer tube (the gap between the inner and outer tubes) of the discharge tube by different methods. In this manner the decomposition ratio was measured. The results are shown in Table 2 below.

TABLE 2

| Freon | | Water vapor | | Quality of discharge* | Decomposition ratio |
|---|---|---|---|---|---|
| Outer tube flow rate | Inner tube | Outer tube flow rate | Inner tube | | |
| 6 L/min | 0 L/min | 0 L/min | 12 L/min | D | — |
| 3 L/min | 3 L/min | 6 L/min | 6 L/min | D | — |
| 0 L/min | 6 L/min | 12 L/min | 0 L/min | D | — |
| 6 L/min | 0 L/min | 12 L/min | 0 L/min | A | 99.99 or more |
| 6 L/min | 0 L/min | 10 L/min | 2 L/min | B | 99% |
| 4 L/min | 2 L/min | 12 L/min | 0 L/min | B | 99% |

*Quality of discharge:
A; Discharge was good, and the discharge tube neither deformed nor melted.
B; Became red-hot.
C; Changed (softened) by melting.
D; Melted immediately after discharge.

As is apparent from Table 2, when freon and water vapor were supplied only to the annular gap between the outer and inner tubes 12 and 13 of the discharge tube 11, a thermal plasma was generated most stably, and the freon was decomposed at high decomposition ratio.

On the other hand, even when freon or water vapor was supplied to the inner tube 13, a thermal plasma was generated if the supply amount was small.

Table 3 below shows the microwave power dependence of the freon decomposition ratio when the freon flow rate and the water vapor flow rate were set to 6 L/min and 12 L/min, respectively, in the structure shown in FIGS. 3 and 4 in which the gas supply pipe 18 was connected to the outer tube 12 of the discharge tube 11 along the direction of tangent of this outer tube 12. Table 3 also shows the comparison of the presence/absence of melting of the discharge tube when the conventional discharge tube shown in FIG. 17 was used.

TABLE 3

| Microwave power | Melting of discharge tube | Decomposition ratio | Prior art |
|---|---|---|---|
| 500W | Not melted | 80% | Not melted |
| 1000W | Not melted | 90% | Softened slightly |
| 1500W | Not melted | 99.99% | Softened largely |
| 2000W | Not melted | 99.99% or more | Melted |

As shown in Table 3, the discharge tube of the conventional apparatus melted as the microwave power increased. In the present invention, however, melting of the discharge tube could be suppressed even when the microwave power was raised.

Third Embodiment

Figure 5:
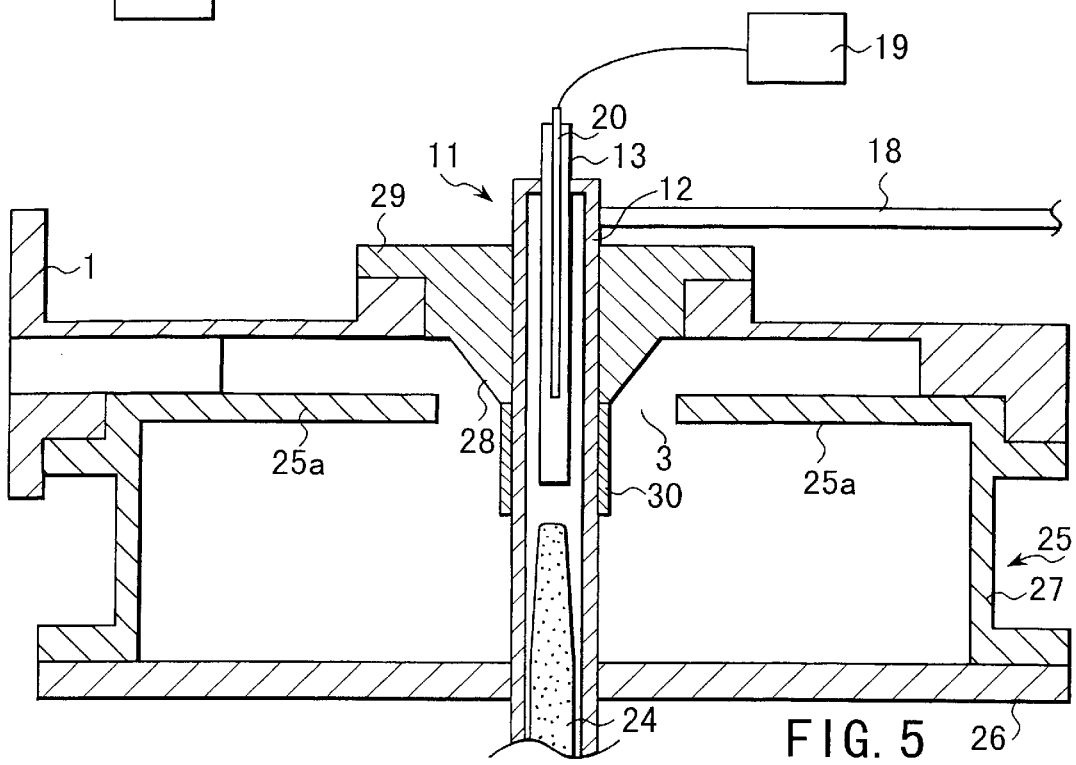
FIG. 5 is a sectional view showing a microwave plasma generator according to the third embodiment of the present invention.

FIG. 5 is a sectional view showing another form of the microwave plasma generator having the cylindrical microwave resonance cavity incorporated into the organic halide decomposing system according to the second embodiment described above. The same reference numerals as in FIGS. 3 and 4 denote the same parts in FIG. 5, and a detailed description thereof will be omitted.

As shown in FIG. 5, this microwave plasma generator has a structure in which an ignition electrode 20 connected to an ignition power supply 19 is inserted into an inner tube 13 of a double-tube discharge tube 11.

Similar to the aforementioned second embodiment, the microwave plasma generator having this construction can reduce the consumption amount of argon gas during the generation of a thermal plasma and suppress damage to the inner tube by the thermal plasma.

Additionally, since the ignition electrode 20 is inserted into the inner tube 13 of the discharge tube 11, ignition can be stably performed with high reproducibility regardless of the thermal plasma state. Consequently, a thermal plasma can be ignited even with low-flow-rate Ar gas.

Freon gas and a gas containing water vapor are supplied through a gas supply pipe 18 into an annular gap formed between an outer tube 12 and the inner tube 13 of the discharge tube 11 of an organic halide decomposing system including the microwave plasma generator shown in FIG. 5, and the ignition power supply 19 is operated to allow the ignition electrode 20 inserted into the inner tube 13 to discharge. As a consequence, as in the second embodiment described above, freon such as freon R12 can be readily decomposed by reaction indicated by formula 1 presented earlier.

EXAMPLE 3

In this Example 3, the organic halide decomposing system including the microwave plasma generator according to the third embodiment described above was used to decompose freon gas under the conditions explained below.

That is, a high-frequency voltage generated by the power supply 19 composed of a Tesla coil shown in FIG. 5 was introduced to the ignition electrode 20 inserted into the inner tube 13 of the discharge tube 11, and Ar gas was supplied to the annular gap between the outer and inner tubes 12 and 13 to discharge. After a thermal plasma was ignited, this thermal plasma was not lost even when the gas supplied to the annular gap was switched to freon and water vapor. Table 4 below shows the results measured by changing the Ar flow rate. Table 4 also shows the results of the prior art using the microwave plasma generator shown in FIG. 17.

TABLE 4

| Ar flow rate | Quality of discharge* | |
|---|---|---|
|  | Present invention | Prior art |
| 2 L/min | B | D |
| 5 L/min | A | C |
| 10 L/min | A | B |

*Quality of discharge:
A; Discharge was good, and the discharge tube neither deformed nor melted.
B; Became red-hot.
C; Changed (softened) by melting.
D; Melted immediately after discharge.

As is evident from Table 4 above, the microwave plasma generator of Example 3 reliably ignited a thermal plasma even at low flow rates at which ignition was difficult to perform by the conventional apparatus.

Fourth Embodiment

Figure 6:
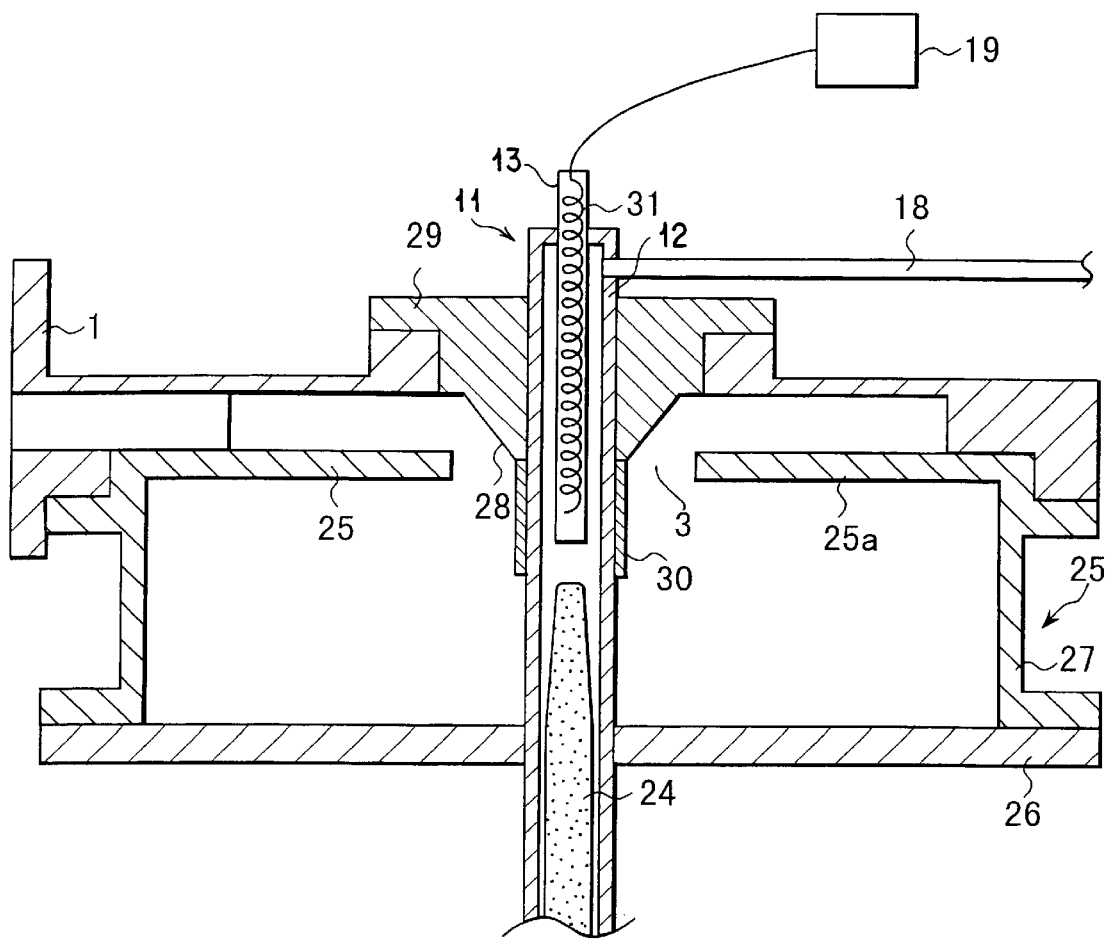
FIG. 6 is a sectional view showing a microwave plasma generator according to the fourth embodiment of the present invention.

FIG. 6 is a sectional view showing another form of the microwave plasma generator having the cylindrical microwave resonance cavity incorporated into the organic halide decomposing system according to the second embodiment described above. The same reference numerals as in FIGS. 3 and 4 denote the same parts in FIG. 6, and a detailed description thereof will be omitted.

As shown in FIG. 6, this microwave plasma generator has a structure in which a coiled ignition electrode 31 connected to an ignition power supply 19 is inserted into an inner tube 13 of a double-tube discharge tube 11.

Similar to the aforementioned second embodiment, the microwave plasma generator having this construction can reduce the consumption amount of argon gas during the generation of a thermal plasma and suppress damage to the inner tube by the thermal plasma.

Additionally, since the coiled ignition electrode 31 is inserted into the inner tube 13 of the discharge tube 11, ignition can be stably performed with high reproducibility regardless of the thermal plasma state. Consequently, a thermal plasma can be ignited even with low-flow-rate Ar gas.

Freon gas and a gas containing water vapor are supplied through a gas supply pipe 18 into an annular gap formed between an outer tube 12 and the inner tube 13 of the discharge tube 11 of an organic halide decomposing system including the microwave plasma generator shown in FIG. 6, and the ignition power supply 19 is operated to allow the coiled ignition electrode 31 inserted into the inner tube 13 to discharge. As a consequence, as in the second embodiment described above, freon such as freon R12 can be readily decomposed by reacting as indicated by formula 1 presented earlier.

EXAMPLE 4

In this Example 4, the organic halide decomposing system including the microwave plasma generator according to the fourth embodiment described above was used to decompose freon gas under the conditions explained below.

That is, a high-frequency voltage generated by the power supply 19 composed of a Tesla coil shown in FIG. 6 was introduced to the coiled ignition electrode 31 inserted into in the inner tube 13 of the discharge tube 11, and Ar gas was supplied to the annular gap between the outer and inner tubes 12 and 13 to discharge. After a thermal plasma was ignited, this thermal plasma was not lost even when the gas supplied to the annular gap was switched to freon and water vapor. Table 5 below shows the results measured by changing the Ar flow rate and the results measured when Ar mixed with moisture was supplied. Table 5 also shows the results of the prior art using the microwave plasma generator shown in FIG. 17.

TABLE 5

| Ar flow rate | Quality of discharge* | |
|---|---|---|
|  | Present invention | Prior art |
| 2 L/min | A | D |
| 5 L/min | A | C |
| 10 L/min | A | B |
| 10 L/min (Moisture present) | A | C |

*Quality of discharge:
A; Discharge was good, and the discharge tube neither deformed nor melted.
B; Became red-hot.
C; Changed (softened) by melting.
D; Melted immediately after discharge.

As is apparent from Table 5 above, the microwave plasma generator of Example 4 reliably ignited a thermal plasma even at low flow rates at which ignition was difficult to perform by the conventional apparatus. Also, when the moisture-containing Ar gas was used, a thermal plasma was ignited with no problem in the present invention, whereas no ignition was possible in the conventional method.

In the second to fourth embodiments described above, freon gas and a gas containing water vapor are supplied into the annular gap formed between the outer and inner tubes 12 and 13 of the discharge tube 11, thereby decomposing the freon. However, the present invention is not limited to these embodiments. For example, it is also possible to supply the organic halide into the inner tube 13 and supply water vapor into the annular gap formed between the outer and inner tubes 12 and 13 to generate a plasma, in the outer tube 12, which extends from the end portion of the inner tube 13 to the end portion of the outer tube 12, thereby decomposing the freon.

Fifth Embodiment

Figure 7:
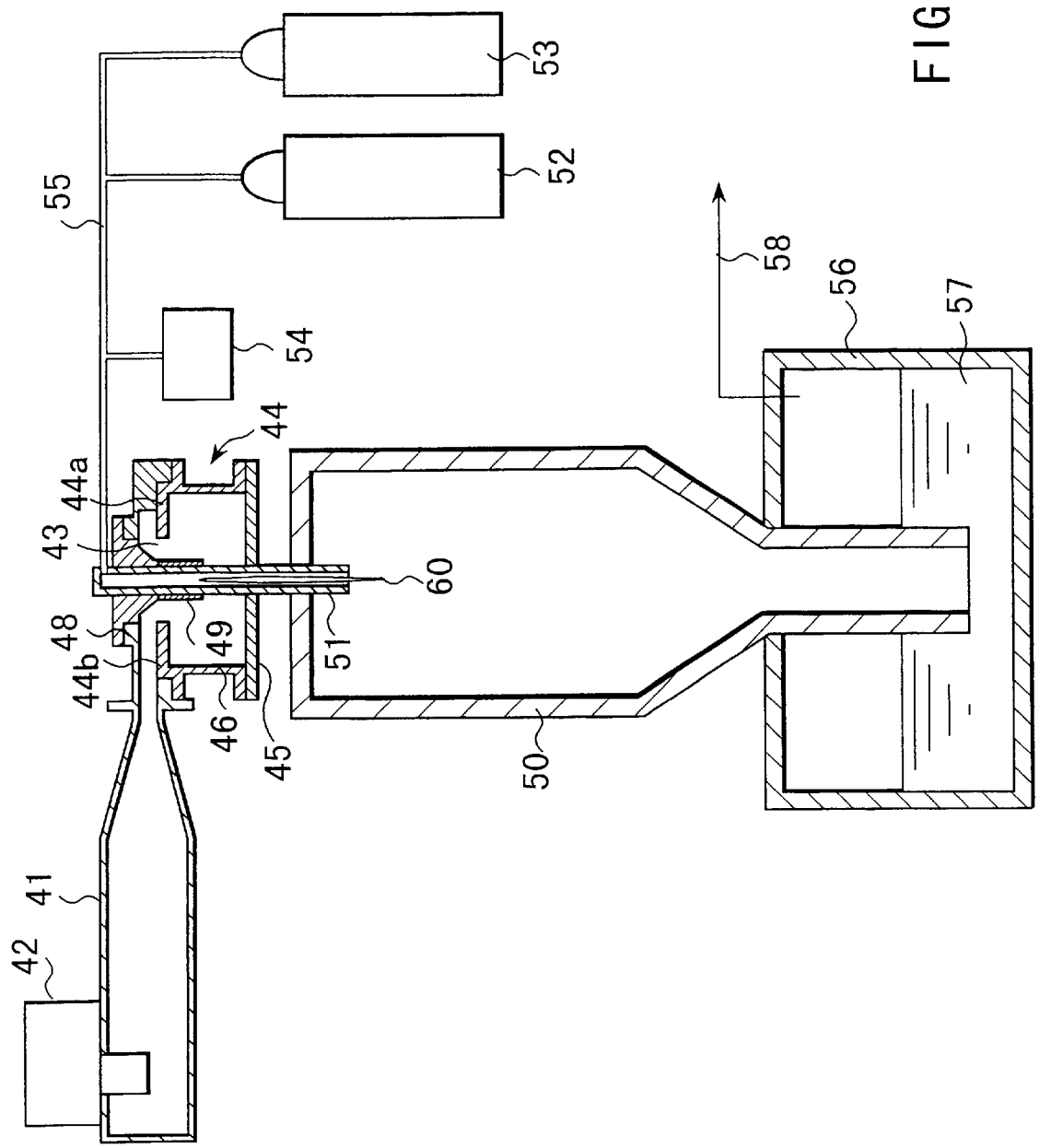
FIG. 7 is a sectional view showing an organic halide decomposing system including a microwave plasma generator according to the fifth embodiment of the present invention.
Figure 8:
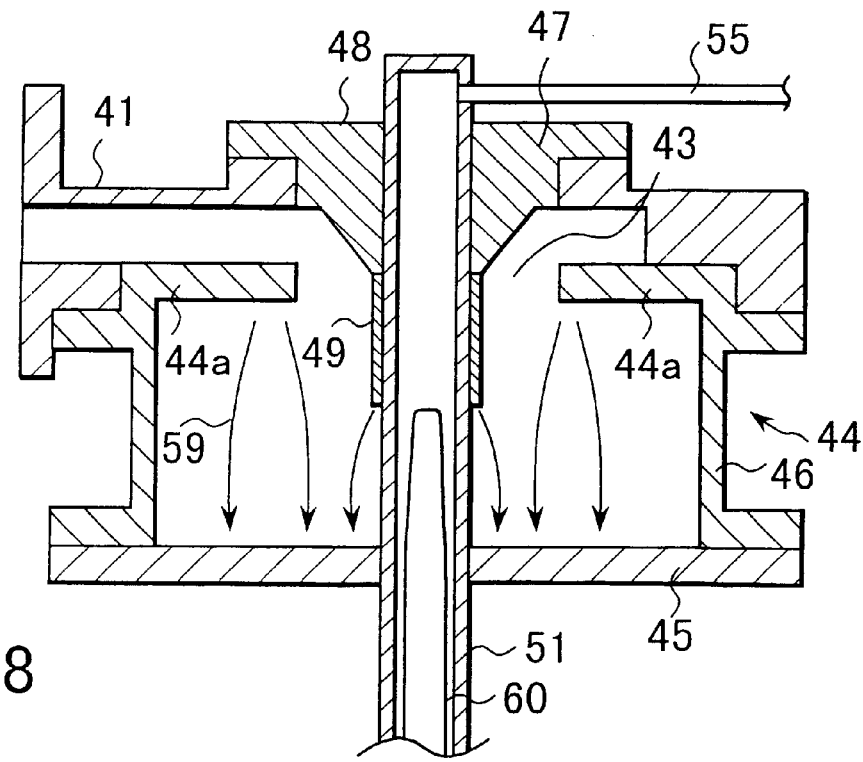
FIG. 8 is a sectional view of the microwave plasma generator shown in FIG. 7.

FIG. 7 is a sectional view showing an organic halide (e.g., freon) decomposing system including a microwave plasma generator having a cylindrical microwave resonance cavity according to the fifth embodiment of the present invention. FIG. 8 is a sectional view of the microwave plasma generator shown in FIG. 7.

Referring to FIG. 7, a horizontally extending rectangular waveguide 41 has a microwave oscillator 42, which oscillates a microwave with a frequency of 2.45 GHz, in its start end portion (left-hand end), and has a hole 43 in this end portion. This rectangular waveguide 41 transmits a microwave from the start end portion toward a terminal end portion (right-hand end).

As shown in FIG. 8, a cylindrical microwave resonance cavity 44 is so connected as to extend vertically by communicating with the hole 43 of the rectangular waveguide 41. This cavity 44 includes an end plate 45, a cylindrical outer conductor 46, a metal conductor 48, and a cylindrical probe antenna 49. The end plate 45 is positioned on the bottom portion of the cavity 44, and the outer conductor 46 is fixed on this end plate 45. The metal conductor 48 is fixed to the rectangular waveguide 41 near the hole 43 and has an inverse conical portion 47 extended into the outer conductor 46. A hole is formed through the center of this metal conductor 48. The probe antenna 49 is extended from the lower end of the inverse conical portion 47 of the metal conductor 48 into the outer conductor 46 and is placed coaxially with the outer conductor 46. Reference numeral 44a denotes a throttle plate which is formed on the upper surface of the cavity 44 and defines the hole 43 of the rectangular waveguide 41, i.e., of the connecting portion between the rectangular waveguide 41 and the cavity 44. A reaction tube 50 is placed below the coaxial microwave cavity 44.

A discharge tube 51 made of a dielectric material, e.g., quartz, runs through the end plate 45 from the hole in the metal conductor 48 via the probe antenna 49 and is inserted into the reaction tube 50. That is, this discharge tube 51 is so placed as to be coaxial with the central axis of the cylindrical microwave resonance cavity 44 and extends through the rectangular waveguide 41 and the cavity 44.

Freon from a freon gas container 52, air from an air container 53, and water vapor from water vapor generator 54 are supplied into the upper portion of the discharge tube 51 through a gas supply pipe 55.

The lower end of the reaction tube 50 is dipped into an aqueous alkali solution 57 in a vessel 56. An exhaust duct 58 is connected to the upper portion of this vessel 56.

The function of the aforementioned microwave plasma generator and a method of decomposing an organic halide, e.g., freon, by using the organic halide decomposing system including this generator will be described below.

The microwave oscillator 42 is operated to generate a microwave. This microwave is transmitted by the rectangular waveguide 41 and then transmitted to the cylindrical microwave resonance cavity 44 through the metal conductor 48 and the probe antenna 49. As a consequence, in the cavity 44 a large axial-direction electric field of $TM_{010}$ mode forms between the probe antenna 49 and the end plate 45. Additionally, this electric field in the cavity 44 is stable because the metal conductor 48 and the probe antenna 49 couple the electric field mode in the rectangular waveguide 41 and the electric field mode in the cylindrical microwave resonance cavity 44. Reference numeral 59 in FIG. 8 denotes an electric field vector when the electric field of $TM_{010}$ mode is formed.

With the microwave thus transmitted into the cylindrical microwave resonance cavity 44, a gas containing an organic halide (e.g., freon gas) is supplied into the discharge tube 51 through the gas supply pipe 55 and irradiated with the microwave. Consequently, a thermal plasma 60 having high electron energy and a temperature of 2,000 to 6,000 K is generated in the discharge tube 51. This thermal plasma 60 extends from the discharge tube 51 into the reaction tube 50 at the lower end of the discharge tube 51. This decomposes the freon gas into the state in which it readily dissociates into chlorine, fluorine, and hydrogen atoms.

In this state, a large amount of energy absorption or the like occurs in the dissociation of the organic halide, and the load fluctuation increases. However, an electric field of $TM_{010}$ mode having large field strength forms, and the electric field mode in the rectangular waveguide 41 is coupled with the electric field mode in the cylindrical microwave resonance cavity 44. Therefore, the organic halide can be stably decomposed against the load fluctuation.

The decomposed gas from the reaction tube 50 is made harmless by passing through the aqueous alkali solution (e.g., calcium hydroxide) 57 contained in the vessel 56. The gas containing carbonic acid gas and the like is exhausted from the exhaust duct 58.

EXAMPLE 5

In this Example 5, the organic halide decomposing system including the microwave plasma generator according to the fifth embodiment described above was used to decompose freon R12 and freon 134a under the conditions explained below.

That is, the inside diameter and length of the coaxial microwave resonance cavity 44 for generating the thermal plasma 60 shown in FIGS. 7 and 8 were set to 90 mm and 35 mm, respectively, and the gap length between the probe antenna 49 and the end plate 45 of the cavity 44 was set to 15 mm. A quartz discharge tube 51 having an outer diameter of 1.2 mm and an inner diameter of 11 mm was placed in the cavity 44 through the metal conductor 48, the probe antenna 49, and the end plate 45.

To a portion of the discharge tube 51 positioned inside the cavity 44, freon (R12) was supplied at the atmospheric pressure and a flow rate of 10 L/min from the freon container 52 through the gas supply pipe 55. At the same time, a 2.45-GHz microwave was introduced from the microwave oscillator 42 into the coaxial microwave resonance cavity 44 via the metal conductor 48 mounted on the rectangular waveguide 41 and the inner conductor 49, thereby generating discharge by an axial-direction electric field of $TM_{010}$ mode formed in this cavity 44.

This discharge was well stable even at the atmospheric pressure compared to a conventional method. Also, the electric field vector 59 obtained analytically maintained high electric field at the center of the coaxial microwave resonance cavity 44.

The freon gas was decomposed in the reaction tube 50 by the thermal plasma 60 discharged and was made harmless by passing through the aqueous alkali solution 57 (calcium hydroxide) in the vessel 56. The remaining gas containing carbonic acid gas and the like was exhausted from the exhaust duct 58.

The decomposition ratio of freon was measured by sampling a portion of the gas from the reaction tube 50 and calculating the presence/absence of a plasma from gas chromatographic analysis of the freon concentration. Table 6 below shows the experimental results of decomposition ratio measurements obtained when the freon supply amount was 1 kg/h and the microwave power was used as a parameter.

The same test was conducted on freon 134a into which air was mixed from the air container 53. The results are also shown in Table 6.

TABLE 6

| Freon supply amount (kg/h) | Microwave power (W) | Freon R12 decomposition ratio (%) | Freon 134a decomposition ratio (%) |
|---|---|---|---|
| 1 | 700 | 90 | 85 |
| 1 | 1000 | 99.99 | 99 |
| 1 | 1200 | 99.99 | 99.99 |

As is apparent from Table 6, in Example 5 freon 134a was similarly decomposable.

Also, it was experimentally confirmed that even when argon, air, or the like was mixed as an additional gas, a substantially equal decomposition ratio was obtained by controlling the microwave power.

Sixth Embodiment

Figure 9:
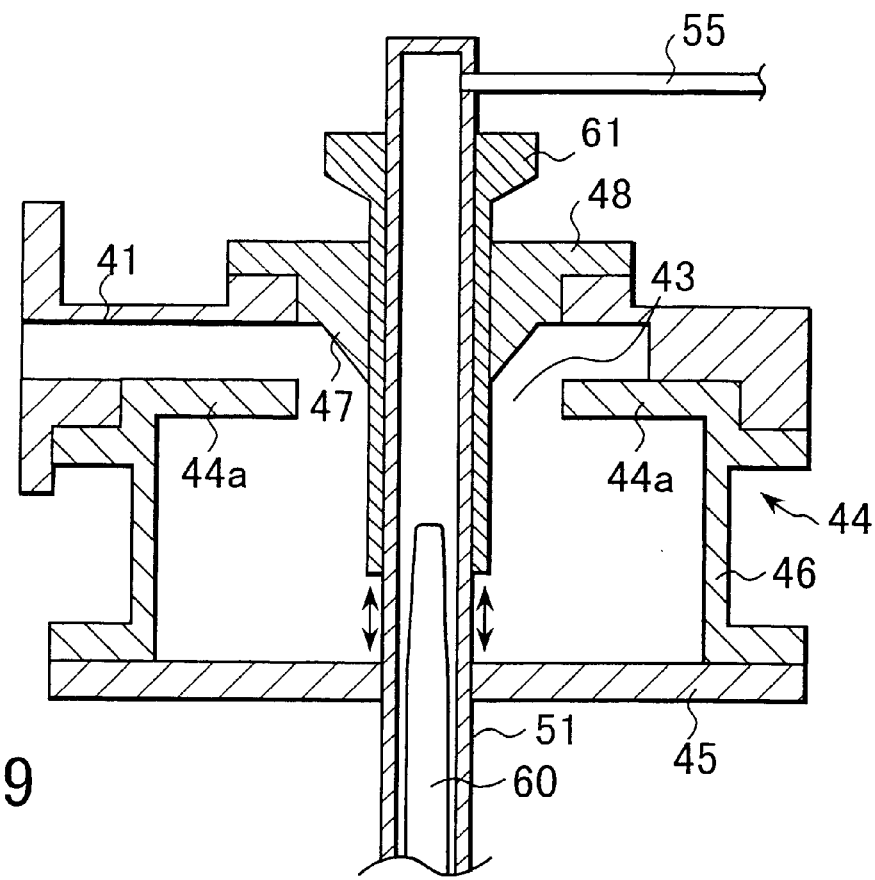
FIG. 9 is a sectional view showing a microwave plasma generator according to the sixth embodiment of the present invention.

FIG. 9 is a sectional view showing another form of the microwave plasma generator having the coaxial microwave resonance cavity incorporated into the organic halide decomposing system according to the fifth embodiment described above. The same reference numerals as in FIGS. 7 and 8 denote the same parts in FIG. 9, and a detailed description thereof will be omitted.

As shown in FIG. 9, this microwave plasma generator has a structure in which a cylindrical slidable probe antenna 61 serving as a tuner for field strength adjustment is interposed between a metal conductor 48 and this discharge tube 51 to be slidable in the axial direction of a discharge tube 51. The metal conductor 48 is fixed to a rectangular waveguide 41 near its hole 43 and surrounds the upper portion of the discharge tube 51. This metal conductor 48 exists in the rectangular waveguide 41 but does not extend into a coaxial microwave resonance cavity 44. The slidable probe antenna 61 transmits a microwave from the metal conductor 48 by slidably contacting the metal conductor 48. This slidable probe antenna 61 extends into the cavity 44 through the hole 43.

In the microwave plasma generator with the above structure, the slidable probe antenna 61 is slid to adjust its length in the coaxial microwave resonance cavity 44. This allows the field strength to be adjusted in accordance with the load fluctuation of a thermal plasma 60 generated in the discharge tube 51. Consequently, the operating power range can be widened with respect to the load fluctuation associated with changes in the plasma conditions. Hence, an organic halide can be decomposed more effectively. Also, discharge can be stabilized even when the addition amount of a gas containing an organic halide and water vapor is changed.

A gas containing an organic halide is supplied into the discharge tube 51 of an organic halide decomposing system including the microwave plasma generator shown in FIG. 9 and irradiated with a microwave by the plasma generator, thereby generating a thermal plasma. As a consequence, the organic halide can be easily decomposed as in the fifth embodiment described above.

EXAMPLE 6

In this Example 6, the organic halide decomposing system including the microwave plasma generator according to the sixth embodiment described above was used to decompose freon R12 under the conditions explained below.

That is, the field strength was adjusted with respect to the load fluctuation of a plasma or the like generated in the discharge tube 51 by controlling the length of the metal conductor inserted into the coaxial microwave resonance cavity 44 from the hole 43 of the rectangular waveguide 41 shown in FIG. 9, i.e., the length of the slidable probe antenna 61.

The freon decomposition ratio with respect to the length of the probe antenna 61 was obtained in the same manner as in Example 5. Table 7 below shows the experimental results of decomposition ratio measurements when the freon supply amount and the water vapor supply amount were 1 kg/h and the microwave power was used as a parameter.

TABLE 7

| Probe length (mm) | Freon supply amount (kg/h) | Water vapor supply amount (kg/h) | Microwave power (W) | Decomposition ratio (%) |
|---|---|---|---|---|
| 5  | 1 | 1 | 1000 | 96    |
| 10 | 1 | 1 | 1000 | 99.99 |
| 15 | 1 | 1 | 1000 | 99    |

As shown in Table 7, freon could be decomposed more efficiently by interposing, between the metal conductor 48 and the discharge tube 51, the cylindrical slidable probe antenna 61, which serves as a tuner for field strength adjustment, to be slidable in the axial direction of the discharge tube 51.

Also, even when argon, air, or the like was mixed as an additional gas, a substantially equal decomposition ratio was obtained by controlling the microwave power.

Seventh Embodiment

Figure 10:
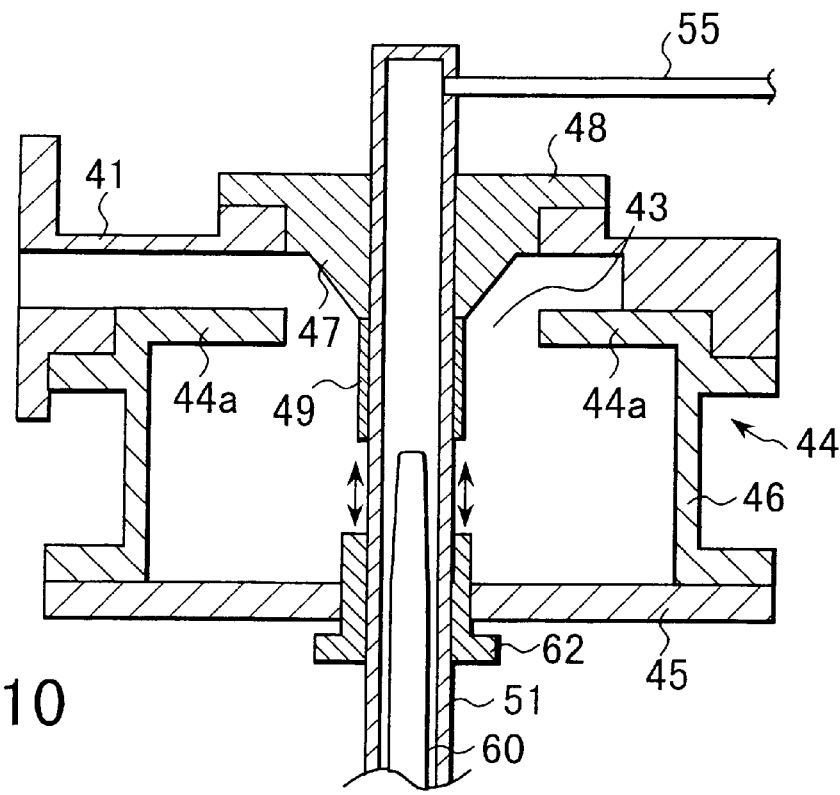
FIG. 10 is a sectional view showing a microwave plasma generator according to the seventh embodiment of the present invention.

FIG. 10 is a sectional view showing still another form of the microwave plasma generator having the coaxial microwave resonance cavity incorporated into the organic halide decomposing system according to the fifth embodiment described above. The same reference numerals as in FIGS. 7 and 8 denote the same parts in FIG. 10, and a detailed description thereof will be omitted.

As shown in FIG. 10, this microwave plasma generator has a structure in which an annular metal conductor 62 is slidably interposed, so as to extend from the exterior to the interior of a coaxial microwave resonance cavity 44, between an end plate 45 of this cavity 44 and a discharge tube 51 extending through the end plate 45.

In the microwave plasma generator with the above structure, the enhancement amount of the strength of an electric field formed in the cavity 44 can be adjusted by slidably moving the annular metal conductor 62 along the axial direction.

A gas containing an organic halide is supplied into the discharge tube 51 of an organic halide decomposing system including the microwave plasma generator shown in FIG. 10 and irradiated with a microwave by the plasma generator, thereby generating a thermal plasma. As a consequence, the organic halide can be easily decomposed as in the fifth embodiment described above.

EXAMPLE 7

In this Example 7, the organic halide decomposing system including the microwave plasma generator according to the seventh embodiment described above was used to decompose freon R12 under the conditions explained below.

That is, freon R12 was decomposed following the same procedure as in Example 5 except that the field strength on the central axis of the coaxial microwave resonance cavity 44 shown in FIG. 10 was enhanced by the annular metal conductor 62 slidably interposed between the end plate 45 of the cavity 44 and the discharge tube 51 extending through the end plate 45, and that water was sprayed upon the generated thermal plasma.

The freon decomposition ratio was obtained in the same manner as in Example 5. Table 8 below shows the experimental results of decomposition ratio measurements when the freon supply amount and the sprayed water supply amount were 1 kg/h and the insertion length of the annular metal conductor 62 was used as a parameter.

TABLE 8

| Insertion length (mm) | Freon supply amount (kg/h) | Water supply amount (kg/h) | Microwave power (W) | Decomposition ratio (%) |
|---|---|---|---|---|
| 0 | 1 | 1 | 500 | 90 |
| 5 | 1 | 1 | 450 | 98 |
| 10 | 1 | 1 | 400 | 99.99 |

As shown in Table 8, freon R12 could be decomposed more efficiently by slidably interposing the annular metal conductor 62 between the end plate 45 of the coaxial microwave resonance cavity 44 and the discharge tube 51 extending through this end plate 45.

Also, even when argon, air, or the like was mixed as an additional gas, a substantially equal decomposition ratio was obtained by controlling the microwave power.

Eighth Embodiment

Figure 11:
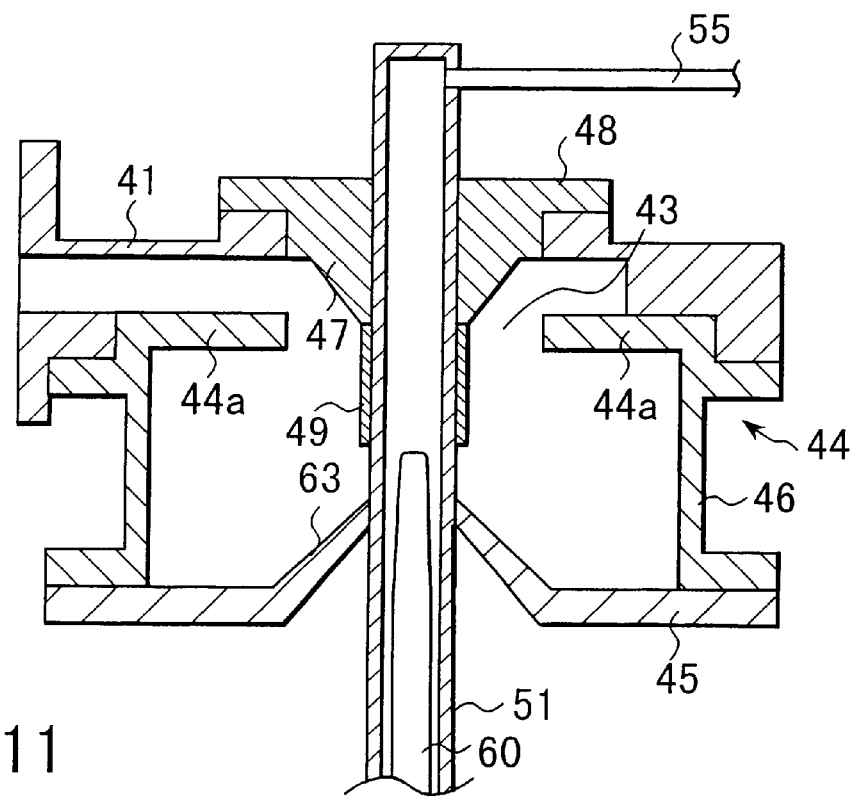
FIG. 11 is a sectional view showing a microwave plasma generator according to the eighth embodiment of the present invention.

FIG. 11 is a sectional view showing still another form of the microwave plasma generator having the coaxial microwave resonance cavity incorporated into the organic halide decomposing system according to the fifth embodiment described above. The same reference numerals as in FIGS. 7 and 8 denote the same parts in FIG. 11, and a detailed description thereof will be omitted.

As shown in FIG. 11, this microwave plasma generator has a structure in which a tapered (conical) projection 63 which projects toward a metal conductor 48 is formed on an end plate 45 of a coaxial microwave resonance cavity 44, through which a discharge tube 51 runs.

In the microwave plasma generator with the above structure, the tapered projection 63 is formed on the end plate 45 through which the discharge tube 51 extends, so the field strength in the coaxial microwave resonance cavity 44 can be enhanced. Also, it is possible to prevent a thermal plasma 60 from contacting the discharge tube 51.

A gas containing an organic halide is supplied into the discharge tube 51 of an organic halide decomposing system including the microwave plasma generator shown in FIG. 11 and irradiated with a microwave by the plasma generator, thereby generating a thermal plasma. As a consequence, the organic halide can be easily decomposed as in the fifth embodiment described above.

EXAMPLE 8

In this Example 8, the organic halide decomposing system including the microwave plasma generator according to the eighth embodiment described above was used to decompose freon R12 under the conditions explained below.

That is, freon R12 was decomposed following the same procedure as in Example 5 except that the tapered projection 63 projecting toward the metal conductor 48 was formed on the end plate 45 of the coaxial microwave resonance cavity 44, through which the discharge tube 51 ran as shown in FIG. 11, and that alkali water was sprayed into the reaction tube and allowed to flow along its wall surface.

The freon decomposition ratio was obtained in the same manner as in Example 5. Table 9 below shows the experimental results of decomposition ratio measurements based on the presence/absence of the tapered projection 63 on the end plate 45 when the freon supply amount was 0.1 kg/h and the supply amount of the alkali water to be sprayed, in which calcium hydroxide was dissolved, was 1 kg/h.

TABLE 9

| Tapered projection | Freon supply amount (kg/h) | Water supply amount (kg/h) | Microwave power (W) | Decomposition ratio (%) |
|---|---|---|---|---|
| Not formed | 1 | 1 | 1000 | 96 or more |
| Formed | 1 | 1 | 1000 | 99 |

As can be seen from Table 9, freon R12 could be decomposed more efficiently by forming the tapered projection 63 on the end plate 45 through which the discharge tube 51 was extended.

Also, even when argon, air, or the like was mixed as an additional gas, a substantially equal decomposition ratio was obtained by controlling the microwave power.

In this Example 8, the method of allowing alkali water to flow on the wall surface of the reaction tube 50 is described as an alkali water supply method. However, alkali water can also be directly sprayed so as to surround the thermal plasma in the reaction tube 50.

Ninth Embodiment

Figure 12:
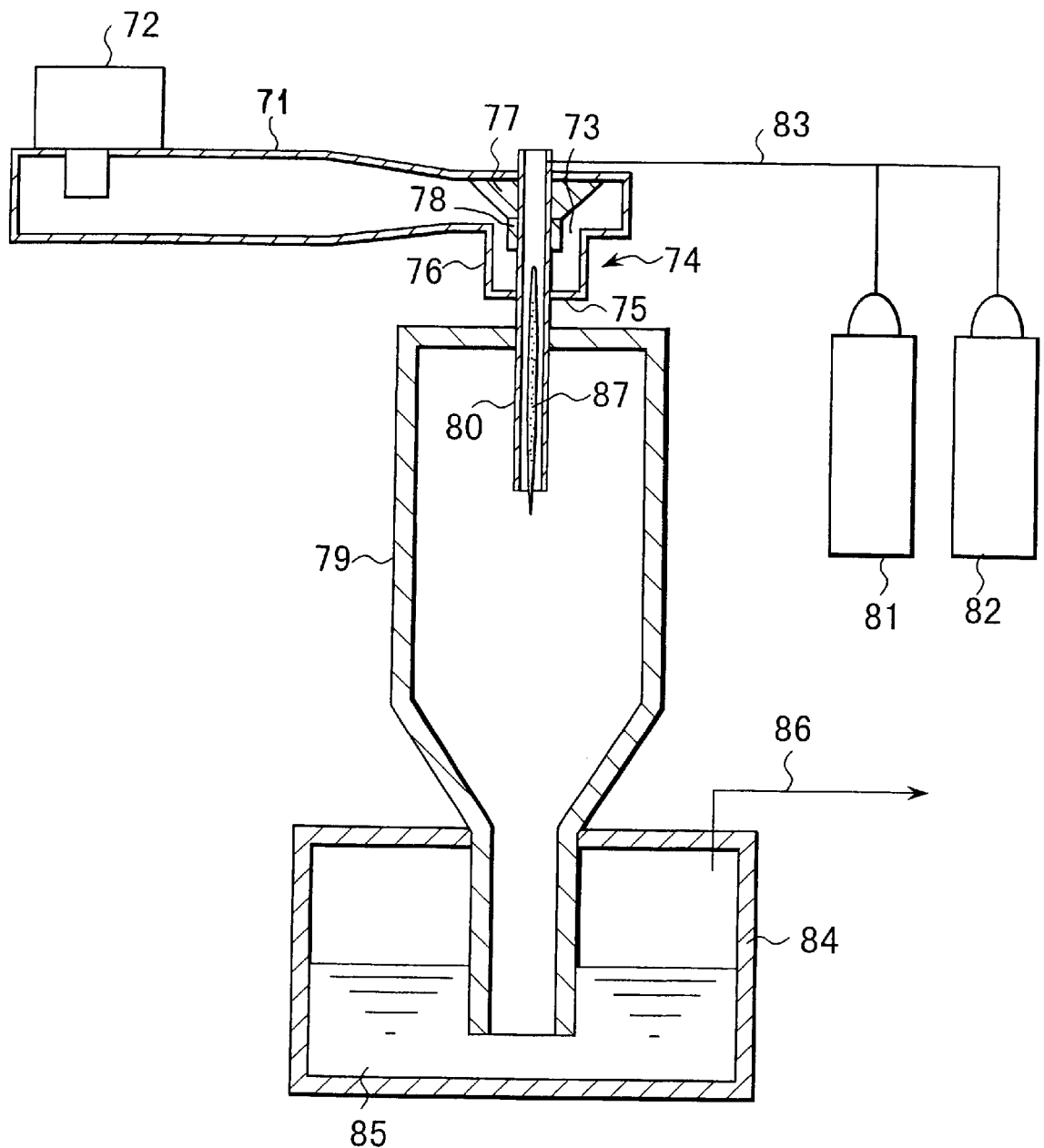
FIG. 12 is a sectional view showing an organic halide decomposing system according to the ninth embodiment of the present invention.

FIG. 12 is a sectional view showing an organic halide (e.g., freon) decomposing system including a microwave plasma generator having a coaxial microwave cavity according to the ninth embodiment of the present invention.

Referring to FIG. 12, a horizontally extending rectangular waveguide 71 has a microwave oscillator 72, which oscillates a microwave with a frequency of 2.45 GHz, in its start end portion (left-hand end), and has a hole 73 in this end portion. This rectangular waveguide 71 transmits a microwave from the start end portion toward a terminal end portion (right-hand end).

A coaxial microwave cavity 74 is so connected as to extend vertically by communicating with the hole 73 of the rectangular waveguide 71. This cavity 74 includes an end plate 75, a cylindrical outer conductor 76, a metal conductor 77, and a cylindrical inner conductor 78. The end plate 75 is positioned on the bottom portion of the cavity 74, and the outer conductor 76 is integrated with this end plate 75. The metal conductor 77 is fixed to the rectangular waveguide 71 near the hole 73 and extended into the outer conductor 76. A hole is formed through the center of this metal conductor 77. The inner conductor 78 runs from the lower end of this metal conductor 77 into the outer conductor 76 and is placed coaxially with the outer conductor 76. A reaction tube 79 is placed below the coaxial microwave cavity 74.

A discharge tube 80 made of a dielectric material, e.g., quartz, runs through the end plate 75 from the hole in the metal conductor 77 via the inner conductor 78 and is inserted into the reaction tube 79. That is, this discharge tube 80 is so placed as to be coaxial with the central axis of the coaxial microwave cavity 74 and extends through the rectangular waveguide 71 and the cavity 74.

Freon from a freon gas container 81 and air from an air container 82 are supplied into the upper end portion of the discharge tube 80 through a gas supply pipe 83.

The lower end of the reaction tube 79 is dipped into an aqueous alkali solution 85 in a vessel 84. An exhaust duct 86 is connected to the upper portion of this vessel 84.

A method of decomposing an organic halide, e.g., freon, by using the organic halide decomposing system including the aforementioned microwave plasma generator will be described below.

The microwave oscillator 72 is operated to generate a microwave. This microwave is transmitted by the rectangular waveguide 71 and then transmitted to the coaxial microwave cavity 74 through the metal conductor 77 and the inner conductor 78. As a consequence, in the cavity 74 an axial-direction electric field forms between the inner conductor 78 and the end plate 75.

With the microwave thus transmitted into the coaxial microwave cavity 74, a gas containing freon gas is supplied into the discharge tube 80 through the gas supply pipe 83 and irradiated with the microwave from the microwave plasma generator. Consequently, a thermal plasma 87 having high electron energy and a temperature of 2,000 to 6,000 K is generated in the discharge tube 80. This thermal plasma 87 extends from the discharge tube 80 into the reaction tube 79 at the lower end of the discharge tube 80. As a result, the freon gas is decomposed.

The decomposed gas from the reaction tube 79 is made harmless by passing through the aqueous alkali solution (e.g., calcium hydroxide) 85 contained in the vessel 84. The gas containing carbonic acid gas and the like is exhausted from the exhaust duct 86.

EXAMPLE 9

In this Example 9, the organic halide decomposing system including the microwave plasma generator according to the ninth embodiment described above was used to decompose freon 134a under the conditions explained below.

That is, the inside diameter and length of the coaxial microwave cavity 74 for generating a thermal plasma shown in FIG. 12 were set to 40 mm and 50 mm, respectively, and the gap length between the inner conductor 78 and the end plate 75 of the cavity 74 was set to 10 mm.

Inside the cavity 74, a quartz discharge tube 80 having an outside diameter of 12 mm and an inside diameter of 11 mm extended through the metal conductor 77, the inner conductor 78, and the end plate 75.

To the discharge tube 80 in the cavity 74, freon 134a was supplied at the atmospheric pressure and a flow rate of 10 L/min from the freon container 81 through the gas supply pipe 83. A 2.45-GHz microwave was introduced from the microwave oscillator 72 into the coaxial microwave cavity 74 via the metal conductor 77 mounted on the rectangular waveguide 71 and the inner conductor 78, thereby discharging by an axial-direction electric field formed between the inner conductor 78 and the end plate 75.

The decomposition ratio of freon was measured by sampling a portion of the gas from the reaction tube 79 and calculating the presence/absence of a plasma from gas chromatographic analysis of the freon concentration. Table 10 below shows the decomposition ratio measurement results obtained when the freon supply amount was 1 kg/h and the microwave power was changed.

TABLE 10

| Freon supply amount (kg/h) | Microwave power (W) | Decomposition ratio (%) |
| --- | --- | --- |
| 0.1 | 400 | 80 |
| 0.1 | 300 | 75 |
| 0.1 | 200 | 50 |

As is apparent from Table 10, freon could be efficiently decomposed by the method of Example 9.

Also, even when argon, air, or the like was mixed as an additional gas, a substantially equal decomposition ratio was obtained by controlling the microwave power.

10th Embodiment

Figure 13:
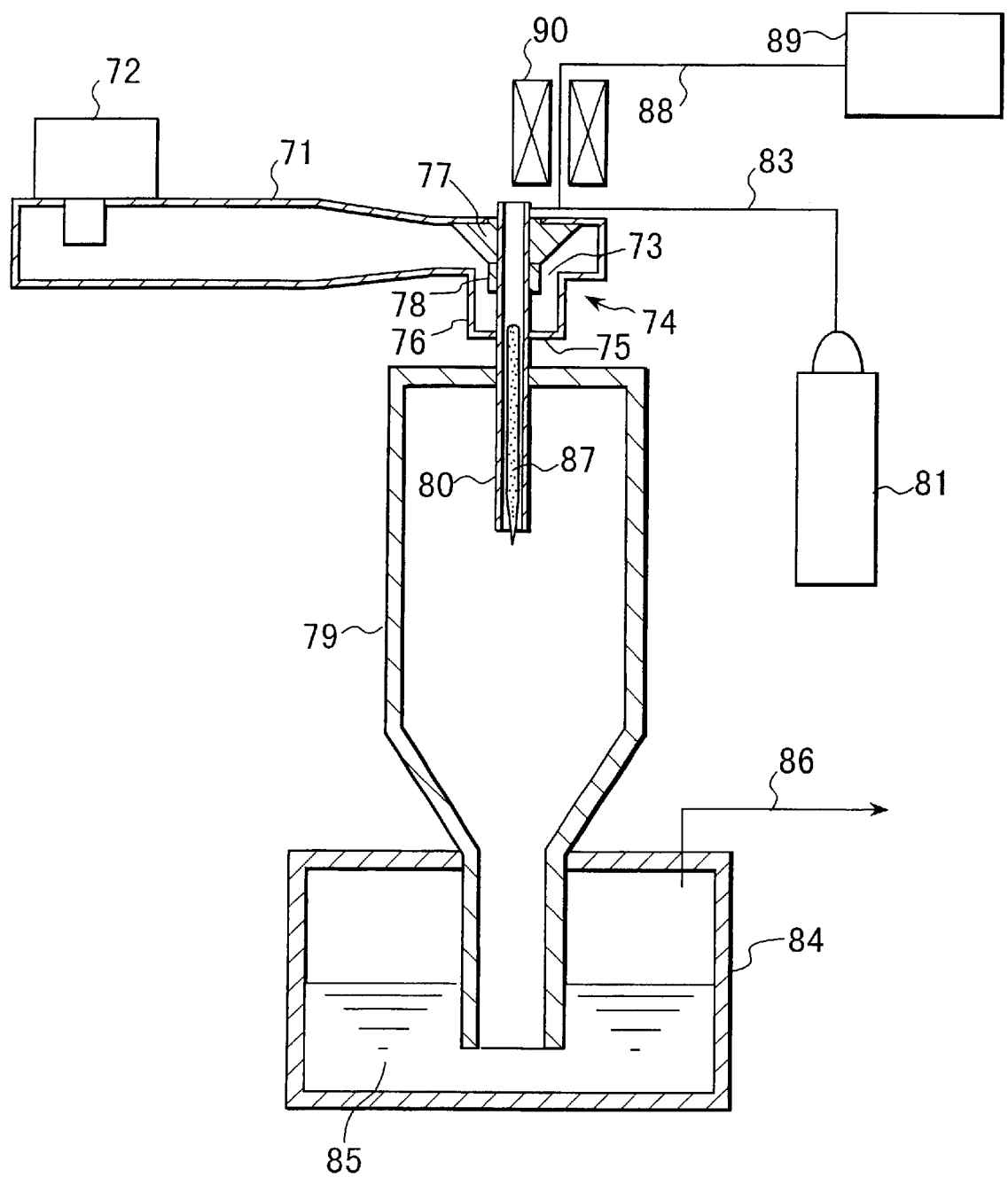
FIG. 13 is a sectional view showing an organic halide decomposing system according to the 10th embodiment of the present invention.

FIG. 13 is a sectional view showing an organic halide (e.g., freon) decomposing system including a microwave plasma generator having a coaxial microwave cavity according to the 10th embodiment of the present invention. The same reference numerals as in FIG. 12 denote the same parts in FIG. 13, and a detailed description thereof will be omitted.

This decomposing system has a structure in which a water supply system 89 is connected to a gas supply pipe 83 via a branch pipe 88, and a ribbon heater 90 as a heating means for heating water flowing in the branch pipe 88 to generate water vapor is placed around the branch pipe 88.

A method of decomposing an organic halide, e.g., freon, by using the organic halide decomposing system including aforementioned microwave plasma generator will be described below.

A microwave oscillator 72 is operated to generate a microwave. This microwave is transmitted by a rectangular waveguide 71 and then transmitted to a coaxial microwave cavity 74 through a metal conductor 77 and an inner conductor 78. As a consequence, in the cavity 74 an axial-direction electric field forms between the inner conductor 77 and an end plate 75.

With the microwave thus transmitted into the coaxial microwave cavity 74, water is supplied from the water supply system 89 to the branch pipe 88. At the same time, this water flowing in the branch pipe 88 was heated by the ribbon heater 90 to supply water vapor to the gas supply pipe 83, and freon is supplied from a freon container 81 to the gas supply pipe 83, thereby supplying a gas containing the freon and the water vapor to a discharge tube 80. Since this gas is irradiated with the microwave from the microwave plasma generator, a thermal plasma 87 having high electron energy and a temperature of 2,000 to 6,000 K is generated in the discharge tube 80. This thermal plasma 87 extends from the discharge tube 80 into a reaction tube 79 at the lower end of the discharge tube 80. This makes the freon gas readily dissociable into chlorine, fluorine, and hydrogen atoms, so the freon gas reacts with the water vapor. For example, freon R12 is readily decomposed by reaction as indicated by formula 1 presented earlier.

The decomposed gas from the reaction tube 79 is made harmless by passing through an aqueous alkali solution (e.g., calcium hydroxide) 85 contained in a vessel 84. The gas containing carbonic acid gas and the like is exhausted from an exhaust duct 86.

EXAMPLE 10

In this Example 10, the organic halide decomposing system including the microwave plasma generator according to the 10th embodiment described above was used to decompose freon 134a under the conditions explained below.

That is, freon 134a was decomposed following the same procedures as in Example 9 except that, as shown in FIG. 13, water was supplied from the water supply system 89 to the branch pipe 88, and simultaneously this water flowing in the branch pipe 88 was heated by the ribbon heater 90 to supply water vapor to the gas supply pipe 83 and freon 134a was supplied from the freon container 81 to the gas supply pipe 83 and to the discharge tube 80.

The freon decomposition ratio was measured following the same procedure as in Example 9. Table 11 below shows the experimental results of decomposition ratio measurements obtained when the freon supply amount and the water vapor supply amount were 0.1 kg/h and the microwave power was used as a parameter.

TABLE 11

| Freon supply amount (kg/h) | Water vapor supply amount (kg/h) | Microwave output (W) | Decomposition ratio (%) |
|---|---|---|---|
| 0.1 | 0.1 | 400 | 99 or more |
| 0.1 | 0.1 | 300 | 99 |
| 0.1 | 0.1 | 200 | 95 |

As is apparent from Table 11, the method of Example 10 by which water vapor was supplied together with freon to the discharge tube 80 could further improve the freon decomposition efficiency, compared to Example 9.

Also, even when argon, air, or the like was mixed as an additional gas, a substantially equal decomposition ratio was obtained by controlling the microwave power.

In this Example 10, the method of thermally vaporizing water flowing in the branch pipe by using the ribbon heater is explained as a water vapor supply method. However, similar effects can be obtained by bubbling air in a vessel heated by a heater or the like and supplying water vapor, corresponding to the saturation vapor pressure, together with freon into the discharge tube.

11th Embodiment

Figure 14:
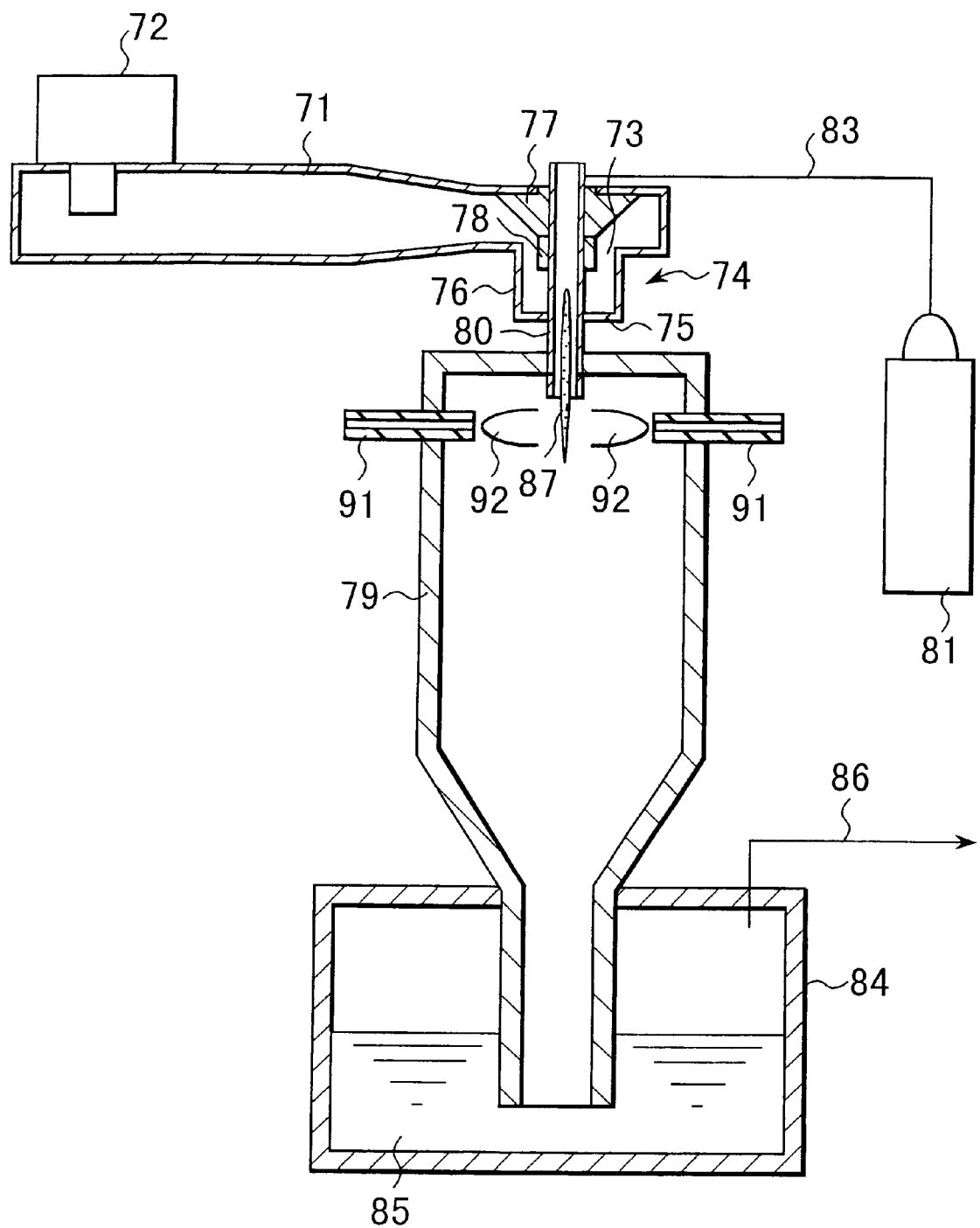
FIG. 14 is a sectional view showing an organic halide decomposing system according to the 11th embodiment of the present invention.

FIG. 14 is a sectional view showing an organic halide (e.g., freon) decomposing system including a microwave plasma generator having a coaxial microwave cavity according to the 11th embodiment of the present invention. The same reference numerals as in FIG. 12 denote the same parts in FIG. 14, and a detailed description thereof will be omitted.

As shown in FIG. 14, this decomposing system has a structure in which two, for example, water spray nozzles 91 are inserted into the circumferential wall of a reaction tube 79 such that the sprayed streams point to a thermal plasma generation region at the lower end of a discharge tube 80.

A method of decomposing an organic halide, e.g., freon, by using the organic halide decomposing system including aforementioned microwave plasma generator will be described below.

A microwave oscillator 72 is operated to generate a microwave. This microwave is transmitted by a rectangular waveguide 71 and then transmitted to a coaxial microwave cavity 74 through a metal conductor 77 and an inner conductor 78. As a consequence, in the cavity 74 an axial-direction electric field forms between the inner conductor 78 and an end plate 75.

With the microwave thus transmitted into the coaxial microwave cavity 74, a gas containing freon is supplied from a freon container 81 into the discharge tube 80 through a gas supply pipe 83. Since this gas is irradiated with the microwave from the microwave plasma generator, a thermal plasma 87 having high electron energy and a temperature of 2,000 to 6,000 K is generated to extend from the discharge tube 80 into the reaction tube 79 at the lower end of the discharge tube 80. This makes the freon gas readily dissociable into chlorine, fluorine, and hydrogen atoms. In this state, water 92 is sprayed upon the thermal plasma 87 from the two water spray nozzles 91 and converted into water vapor. Consequently, the freon in the abovementioned easily dissociable state reacts with the water vapor. For example, freon R12 is readily decomposed by reacting as indicated by formula 1 presented earlier.

The decomposed gas from the reaction tube 79 is made harmless by passing through an aqueous alkali solution (e.g., calcium hydroxide) 85 contained in a vessel 84. The gas containing carbonic acid gas and the like is exhausted from an exhaust duct 86.

EXAMPLE 11

In this Example 11, the organic halide decomposing system including the microwave plasma generator according to the 11th embodiment described above was used to decompose freon 134a under the conditions explained below.

That is, freon 134a was decomposed following the same procedures as in Example 9 except that, as shown in FIG. 14, the water 92 was sprayed upon the thermal plasma 87 from the two water spray nozzles 91.

The freon decomposition ratio was measured following the same procedure as in Example 9. Table 12 below shows the experimental results of decomposition ratio measurements obtained when the freon supply amount and the sprayed water supply amount were 0.1 kg/h and the microwave power was used as a parameter.

TABLE 12

| Freon supply amount (kg/h) | Water vapor supply amount (kg/h) | Microwave output (W) | Decomposition ratio (%) |
|---|---|---|---|
| 0.1 | 0.1 | 500 | 99 or more |
| 0.1 | 0.1 | 450 | 98 |
| 0.1 | 0.1 | 400 | 90 |

As shown in Table 12, the method of Example 11 by which water vapor was supplied together with freon to the discharge tube 80 could further improve the freon decomposition efficiency, compared to Example 9.

Also, even when argon, air, or the like was mixed as an additional gas, a substantially equal decomposition ratio was obtained by controlling the microwave power.

In this Example 11, the method of spraying water from the two water spray nozzles opposing each other is described as a water supply method. However, the decomposition ratio can further improve when water spray nozzles are installed such that water is sprayed all over the plasma in the reaction tube.

12th Embodiment

Figure 15:
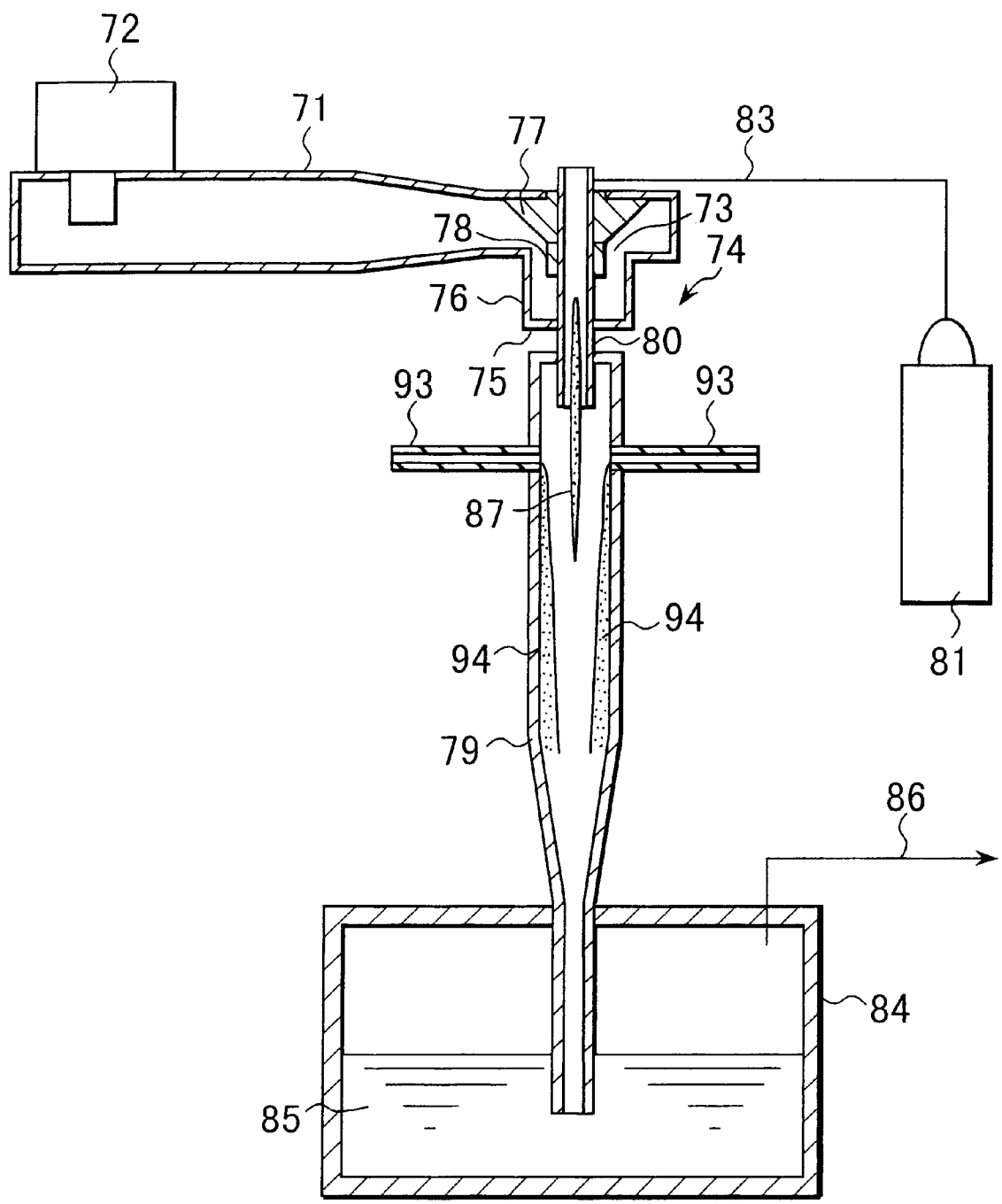
FIG. 15 is a sectional view showing an organic halide decomposing system according to the 12th embodiment of the present invention.

FIG. 15 is a sectional view showing an organic halide (e.g., freon) decomposing system including a microwave plasma generator having a coaxial microwave cavity according to the 12th embodiment of the present invention. The same reference numerals as in FIG. 12 denote the same parts in FIG. 15, and a detailed description thereof will be omitted.

As shown in FIG. 15, this decomposing system has a structure in which two, for example, alkali water supply pipes 93 are connected to the circumferential wall of a reaction tube 79 such that their end portions oppose a thermal plasma generation region at the lower end of a discharge tube 80.

A method of decomposing an organic halide, e.g., freon, by using the organic halide decomposing system including aforementioned microwave plasma generator will be described below.

A microwave oscillator 72 is operated to generate a microwave. This microwave is transmitted by a rectangular waveguide 71 and then transmitted to a coaxial microwave cavity 74 through a metal conductor 77 and an inner conductor 78. As a consequence, in the cavity 74 an axial-direction electric field forms between the inner conductor 77 and an end plate 75.

With the microwave thus transmitted into the coaxial microwave cavity 74, a gas containing freon is supplied from a freon container 81 into the discharge tube 80 through a gas supply pipe 83. Since this gas is irradiated with the microwave from the microwave plasma generator, a thermal plasma 87 having high electron energy and a temperature of 2,000 to 6,000 K is generated to extend from the discharge tube 80 into the reaction tube 79 at the lower end of the discharge tube 80. This makes the freon gas readily dissociable into chlorine, fluorine, and hydrogen atoms. In this state, alkali water 94 is supplied from the alkali water supply pipes 93 along the inner surface of the circumferential wall of the reaction tube 79, thereby generating water vapor by the heat of the thermal plasma 87. Consequently, the freon in the abovementioned easily dissociable state reacts with the water vapor. For example, freon R12 is readily decomposed by reaction indicated by formula 1 presented earlier. At the same time, the decomposed gas reacts with alkali water (e.g., an aqueous calcium hydroxide solution) and is made harmless in the form of a halide salt.

The decomposed gas which is not rendered harmless from the reaction tube 79 is made harmless by passing through an aqueous alkali solution (e.g., calcium hydroxide) 85 contained in a vessel 84. A gas containing carbonic acid gas and the like is exhausted from an exhaust duct 86.

EXAMPLE 12

In this Example 12, the organic halide decomposing system including the microwave plasma generator according to the 12th embodiment described above was used to decompose freon 134a ($CH_2CF_4$) under the conditions explained below.

That is, freon 134a was decomposed following the same procedures as in Example 9 except that, as shown in FIG. 15, the alkali water (aqueous calcium hydroxide solution) 94 was supplied from the two alkali water supply pipes 93 along the inner surface of the circumferential wall of the reaction tube 79.

The freon decomposition ratio was measured following the same procedure as in Example 9. Table 13 below shows the experimental results of decomposition ratio measurements obtained when the freon supply amount and the supply amount of alkali water to be sprayed, in which calcium hydroxide was dissolved, were 0.1 kg/h and the microwave power was used as a parameter.

TABLE 13

| Freon supply amount (kg/h) | Alkali water supply amount (kg/h) | Microwave output (W) | Decomposition ratio (%) |
| --- | --- | --- | --- |
| 0.1 | 0.1 | 450 | 99 or more |
| 0.1 | 0.1 | 400 | 98 |
| 0.1 | 0.1 | 300 | 90 |

As shown in Table 13, the method of Example 12 by which alkali water was supplied along the inner surface of the circumferential wall of the reaction tube 79 could further improve the freon decomposition efficiency, compared to Example 9.

Also, even when argon, air, or the like was mixed as an additional gas, a substantially equal decomposition ratio was obtained by controlling the microwave power.

In this Example 12, the method of supplying alkali water along the inner wall surface of the reaction tube is described as an alkali water supply method. However, alkali water can also be directly sprayed to surround the plasma in the reaction tube.

13th Embodiment

Figure 16:
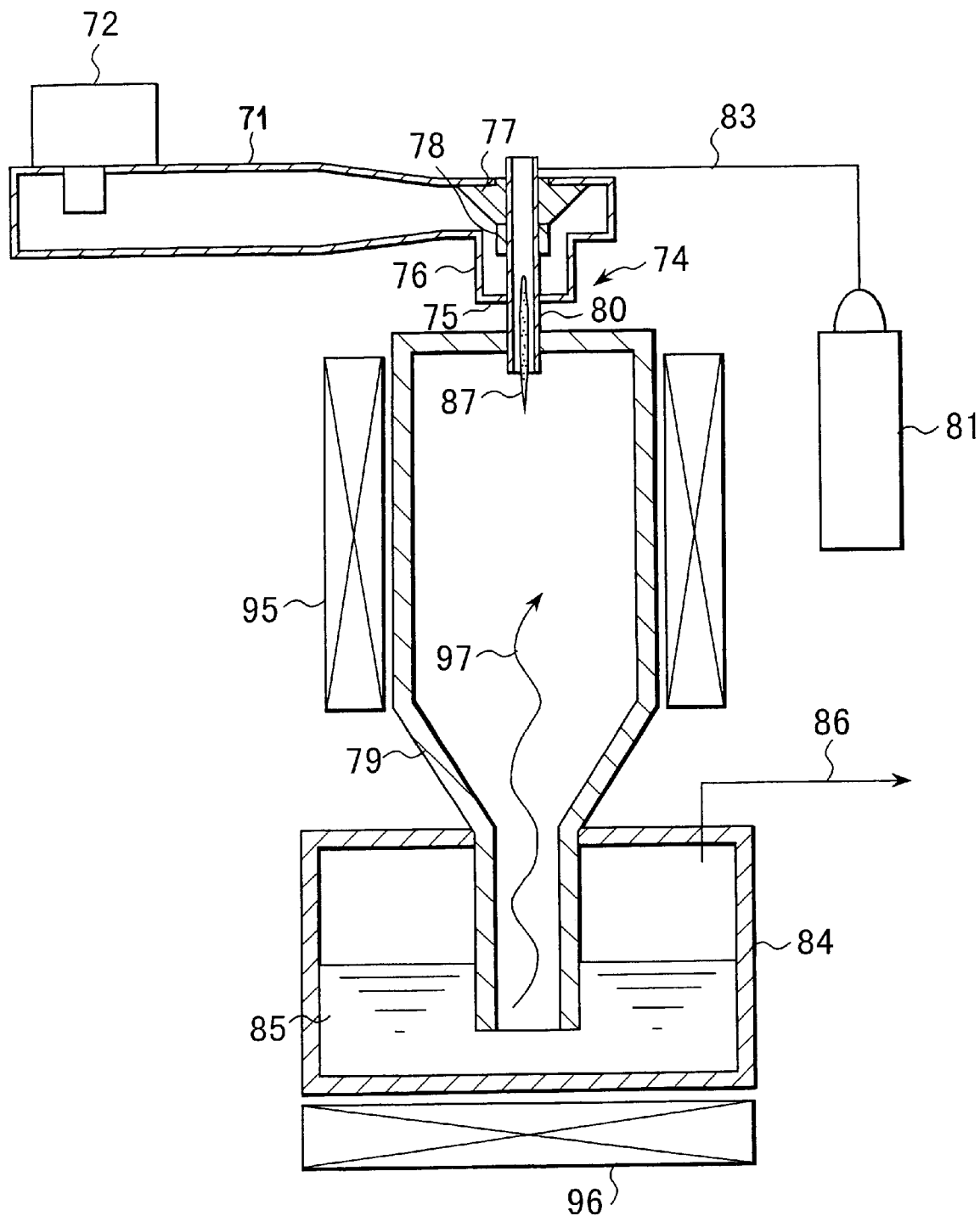
FIG. 16 is a sectional view showing an organic halide decomposing system according to the 13th embodiment of the present invention.

FIG. 16 is a sectional view showing an organic halide (e.g., freon) decomposing system including a microwave plasma generator having a coaxial microwave cavity according to the 13th embodiment of the present invention. The same reference numerals as in FIG. 12 denote the same parts in FIG. 16, and a detailed description thereof will be omitted.

As shown in FIG. 16, this decomposing system has a structure in which heaters 95 and 96 are installed around the circumferential wall of a reaction tube 79 and below the bottom of a vessel 84, respectively.

Note that heaters need not be installed on both the circumferential wall of the reaction tube 79 and the bottom of the vessel 84; one heater need only be installed on one of them. However, to supply an enough amount of water vapor into the reaction tube 79, heaters are preferably installed on both members.

A method of decomposing an organic halide, e.g., freon, by using the organic halide decomposing system including aforementioned microwave plasma generator will be described below.

A microwave oscillator 72 is operated to generate a microwave. This microwave is transmitted by a rectangular waveguide 71 and then transmitted to a coaxial microwave cavity 74 through a metal conductor 77 and an inner conductor 78. As a consequence, in the cavity 74 an axial-direction electric field is formed between the inner conductor 77 and an end plate 75.

With the microwave thus transmitted into the coaxial microwave cavity 74 as described above, a gas containing freon is supplied from a freon container 81 into a discharge tube 80 through a gas supply pipe 83. Since this gas is irradiated with the microwave from the microwave plasma generator, a thermal plasma 87 having high electron energy and a temperature of 2,000 to 6,000 K is generated to extend from the discharge tube 80 into the reaction tube 79 at the lower end of the discharge tube 80. This makes the freon gas readily dissociable into chlorine, fluorine, and hydrogen atoms. In this state, the heaters 95 and 96 heat the reaction tube 79 and the vessel 84 to vaporize an aqueous alkali solution 85 contained in the vessel 84, thereby supplying water vapor to the thermal plasma 87. Consequently, the freon in the abovementioned easily dissociable state reacts with the water vapor. For example, freon R12 is readily decomposed by reaction indicated by formula 1 presented earlier.

The decomposed gas from the reaction tube 79 is made harmless by passing through the aqueous alkali solution (e.g., calcium hydroxide) 85 contained in the vessel 84. A gas containing carbonic acid gas and the like is exhausted from an exhaust duct 86.

EXAMPLE 13

In this Example 13, the organic halide decomposing system including the microwave plasma generator according to the 13th embodiment described above was used to decompose freon 134*a* under the conditions explained below.

That is, freon 134*a* was decomposed following the same procedures as in Example 9 except that, as shown in FIG. 16, the reaction tube 79 and the vessel 84 were heated to a temperature of 85° C. by the heaters 95 and 96 to vaporize the aqueous alkali water 85 contained in the vessel 84, thereby supplying water vapor to the thermal plasma 87 generated in the discharge tube 80.

The freon decomposition ratio was measured following the same procedure as in Example 9. Table 14 below shows the experimental results of decomposition ratio measurements obtained when the freon supply amount was 0.1 kg/h, alkali water was heated to 85° C., and the microwave power was used as a parameter.

TABLE 14

| Freon supply amount (kg/h) | Alkali water supply amount (kg/h) | Microwave output (W) | Decomposition ratio (%) |
| --- | --- | --- | --- |
| 0.1 | 85 | 600 | 99 or more |
| 0.1 | 85 | 500 | 98 |
| 0.1 | 85 | 450 | 90 |

As can be seen from Table 14, the method of Example 13 by which the heaters 95 and 96 heated the reaction tube 79 and the vessel 84, respectively, to vaporize the aqueous alkali water 85 contained in the vessel 84 and thereby introduced water vapor into the reaction tube 79 could further improve the freon decomposition efficiency, compared to Example 9.

Also, even when argon, air, or the like was mixed as an additional gas, a substantially equal decomposition ratio was obtained by controlling the microwave power.

A microwave plasma generator according to the present invention has an effect of stably generating a thermal plasma consisting of a gas mixture of an organic halide, such as freon, and water vapor. In a discharge tube having a double-tube structure, the gap between inner and outer tubes has neither a tapered portion nor a narrowed flow path. This maintains a swirling flow effect and can prevent melting of the discharge tube and adhesion of solid matter. Also, since a thermal plasma can be stably generated, the consumption of argon can be suppressed.

Another microwave plasma generator according to the present invention can stably maintain continuous discharge for long time periods. Also, high microwave input power and abrupt fluctuations of the load can be easily controlled. Furthermore, a cylindrical microwave resonance cavity can be adjusted in accordance with the load, so discharge can be readily induced in accordance with the sample.

In an organic halide decomposing method according to the present invention, organic halides such as freon and trichloromethane in wastes or exhaust gases, which are conventionally difficult to decompose, can be made harmless at a high decomposition ratio (99.99% or more).

Furthermore, in an organic halide decomposing system according to the present invention, a cylindrical microwave resonance cavity efficiently and convergently supplies high microwave power to a gas containing an organic halide. Therefore, a stable plasma can be efficiently generated, and the size and cost of the apparatus can be decreased.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A microwave plasma generator comprising:
   a rectangular waveguide having a hole to transmit a microwave;
   a coaxial microwave cavity connected to said rectangular waveguide by communicating with the hole; and
   a discharge tube which is made of a dielectric material, extends through the hole of said rectangular waveguide, and extends through said cavity so as to be coaxial with a central axis of said cavity,
   wherein said discharge tube has a double-tube structure including outer and inner tubes,
   a sectional area of an annular gap formed between said outer and inner tubes is constant over an entire length of said inner tube, and
   an end portion of said inner tube has a gas injection opening having the same diameter as an internal cavity of said inner tube.

2. A generator according to claim 1, further comprising an ignition electrode installed in said inner tube to generate microwave discharge.

3. A generator according to claim 1, further comprising an ignition coil installed in said inner tube to generate microwave discharge.

4. A generator according to any one of claims 1 to 3, further comprising a gas supply pipe installed in the gap between said outer and inner tubes along the direction of tangent of said outer tube.

5. A microwave plasma generator comprising:
   a rectangular waveguide having a hole to transmit a microwave;
   a cylindrical microwave resonance cavity which is connected to said rectangular waveguide by communicating with the hole and is placed such that a central axis of said resonance cavity aligns with the direction of electric field in said rectangular waveguide; and
   a discharge tube which is made of a dielectric material, extends through the hole of said rectangular waveguide, and extends through said resonance cavity so as to be coaxial with the central axis of said cavity,
   wherein said discharge tube has a double-tube structure including outer and inner tubes,
   a sectional area of an annular gap formed between said outer and inner tubes is constant over an entire length of said inner tube, and an end portion of said inner tube has a gas injection opening having the same diameter as an internal cavity of said inner tube.

6. A generator according to claim 5, further comprising an ignition electrode installed in said inner tube to generate microwave discharge.

7. A generator according to claim 5, further comprising an ignition coil installed in said inner tube to generate microwave discharge.

8. A generator according to any one of claims 5 to 7, further comprising a gas supply pipe installed in the gap between said outer and inner tubes along the direction of tangent of said outer tube.

9. A microwave plasma generator comprising:
   a rectangular waveguide having a hole to transmit a microwave;
   a cylindrical microwave resonance cavity which is connected to said rectangular waveguide by communicating with the hole and is placed such that a central axis of said resonance cavity aligns with the direction of electric field in said rectangular waveguide;
   a discharge tube which is made of a dielectric material, extends through the hole of said rectangular waveguide, and extends through said resonance cavity so as to be coaxial with the central axis of said cavity; and
   a metal conductor which is connected, while being fitted in said discharge tube, to a portion of said discharge tube near the hole, and extends into said resonance cavity through the hole.

10. A generator according to claim 9, wherein said cylindrical microwave resonance cavity internally forms an electric field of $TM_{010}$ mode.

11. A microwave plasma generator comprising:
   a rectangular waveguide having a hole to transmit a microwave;
   a cylindrical microwave resonance cavity which is connected to said rectangular waveguide by communicating with the hole and is placed such that a central axis of said resonance cavity aligns with the direction of electric field in said rectangular waveguide;
   a discharge tube which is made of a dielectric material, extends through the hole of said rectangular waveguide, and extends through said resonance cavity so as to be coaxial with the central axis of said cavity;
   a metal conductor which is connected, while being fitted in said discharge tube, to a portion of said discharge tube near the hole, and extends into said resonance cavity through the hole; and
   a slidable probe antenna which is interposed between said metal conductor and said discharge tube so as to be slidable in an axial direction of said discharge tube, and extends into said resonance cavity through the hole in said rectangular waveguide.

12. A generator according to claim 11, wherein said cylindrical microwave resonance cavity internally forms an electric field of $TM_{010}$ mode.

13. A microwave plasma generator comprising:
   a rectangular waveguide having a hole to transmit a microwave;
   a cylindrical microwave resonance cavity which is connected to said rectangular waveguide by communicating with the hole, is placed such that a central axis of said resonance cavity aligns with the direction of electric field in said rectangular waveguide, and has an end plate on a bottom portion;
   a discharge tube which is made of a dielectric material, extends through the hole of said rectangular waveguide, and extends through said resonance cavity so as to be coaxial with the central axis of said cavity;
   a metal conductor which is connected, while being fitted in said discharge tube, to a portion of said discharge tube near the hole, and extends into said resonance cavity through the hole; and
   an annular metal conductor which is interposed between said end plate of said resonance cavity and said discharge tube extending through said end plate, and extends from the outside to the inside of said cavity.

14. A generator according to claim 13, wherein said cylindrical microwave resonance cavity internally forms an electric field of $TM_{010}$ mode.

15. A microwave plasma generator comprising:
   a rectangular waveguide having a hole to transmit a microwave;
   a cylindrical microwave resonance cavity which is connected to said rectangular waveguide by communicating with the hole, is placed such that a central axis of said resonance cavity aligns with the direction of electric field in said rectangular waveguide, and has an end plate on a bottom portion;
   a discharge tube made of a dielectric material, extends through the hole of said rectangular waveguide, and extends through said resonance cavity so as to be coaxial with the central axis of said cavity; and
   a metal conductor which is connected, while being fitted in said discharge tube, to a portion of said discharge tube near the hole, and extends into said resonance cavity through the hole,
      wherein said end plate of said resonance cavity has a tapered projection, which projects toward said metal conductor, in a portion through which said discharge tube extends.

16. A generator according to claim 15, wherein said cylindrical microwave resonance cavity internally forms an electric field of $TM_{010}$ mode.

17. A system for decomposing an organic halide, comprising:
   a rectangular waveguide having a hole to transmit a microwave;
   a coaxial microwave cavity connected to said rectangular waveguide by communicating with the hole;
   a reaction tube placed below said cavity;
   a discharge tube made of a dielectric material, extending through the hole of said rectangular waveguide and extending into said reaction tube through said cavity so as to be coaxial with the central axis of said cavity;
   a metal conductor which is connected, while being fitted in said discharge tube, to a portion of said discharge tube near the hole, and extends into said resonance cavity through the hole;
   a vessel into which a lower end of said reaction tube is inserted and which contains an aqueous alkali solution; and
   gas supply means for supplying a gas containing an organic halide to said discharge tube.

18. A system for decomposing an organic halide, comprising:
   a rectangular waveguide having a hole to transmit a microwave;
   a coaxial microwave cavity connected to said rectangular waveguide by communicating with the hole;

a reaction tube placed below said cavity;

a discharge tube which is made of a dielectric material, extends through the hole of said rectangular waveguide, and extends into said reaction tube through said cavity so as to be coaxial with the central axis of said cavity;

a metal conductor which is connected, while being fitted in said discharge tube, to a portion of said discharge tube near the hole, and extends into said resonance cavity through the hole;

a vessel into which a lower end of said reaction tube is inserted and which contains an aqueous alkali solution;

gas supply means for supplying a gas containing an organic halide to said discharge tube through first piping;

water supply means connected to said first piping through second piping; and heating means, provided for said second piping, for converting water flowing in said second piping into water vapor.

19. A system for decomposing an organic halide, comprising:

a rectangular waveguide having a hole to transmit a microwave;

a coaxial microwave cavity connected to said rectangular waveguide by communicating with the hole;

a reaction tube placed below said cavity;

a discharge tube which is made of a dielectric material, extends through the hole of said rectangular waveguide, and extends into said reaction tube through said cavity so as to be coaxial with the central axis of said cavity;

a metal conductor which is connected, while being fitted in said discharge tube, to a portion of said discharge tube near the hole, and extends into said resonance cavity through the hole;

a vessel into which a lower end of said reaction tube is inserted and which contains an aqueous alkali solution;

gas supply means for supplying a gas containing an organic halide to said discharge tube; and water vapor spraying means, formed in a circumferential wall of said reaction tube, for spraying water vapor into a thermal plasma generation region near a lower end portion of said discharge tube.

20. A system for decomposing an organic halide, comprising:

a rectangular waveguide having a hole to transmit a microwave;

a coaxial microwave cavity connected to said rectangular waveguide by communicating with the hole;

a reaction tube placed below said cavity;

a discharge tube which is made of a dielectric material, extends through the hole of said rectangular waveguide, and extends into said reaction tube through said cavity so as to be coaxial with the central axis of said cavity;

a metal conductor which is connected, while being fitted in said discharge tube, to a portion of said discharge tube near the hole, and extends into said resonance cavity through the hole;

a vessel into which a lower end of said reaction tube is inserted and which contains an aqueous alkali solution;

gas supply means for supplying a gas containing an organic halide to said discharge tube; and alkali water spraying means, formed in a side wall of said reaction tube, for spraying alkali water into a thermal plasma generation region near a lower end portion of said discharge tube.

21. A system for decomposing an organic halide, comprising:

a rectangular waveguide having a hole to transmit a microwave;

a coaxial microwave cavity connected to said rectangular waveguide by communicating with the hole;

a reaction tube placed below said cavity;

a discharge tube which is made of a dielectric material, extends through the hole of said rectangular waveguide, and extends into said reaction tube through said cavity so as to be coaxial with the central axis of said cavity;

a metal conductor which is connected, while being fitted in said discharge tube, to a portion of said discharge tube near the hole, and extends into said resonance cavity through the hole;

a vessel into which a lower end of said reaction tube is inserted and which contains an aqueous alkali solution;

gas supply means for supplying a gas containing an organic halide to said discharge tube; and heating means, installed in at least one of a position around said reaction tube and a position below said vessel, for vaporizing the aqueous alkali solution in said vessel and introducing water vapor into a thermal plasma generation region near a lower end portion of said discharge tube.

* * * * *